(12) United States Patent
Griswold et al.

(10) Patent No.: US 11,791,748 B2
(45) Date of Patent: Oct. 17, 2023

(54) SMART WHEEL ENERGY HARVESTER

(71) Applicant: TDK CORPORATION, Tokyo (JP)

(72) Inventors: Ryan Griswold, Los Gatos, CA (US); John Sze, Saratoga, CA (US); Vibhu Vivek, Santa Clara, CA (US)

(73) Assignee: TDK CORPORATION, Tokyo (JP)

( * ) Notice: Subject to any disclaimer, the term of this patent is extended or adjusted under 35 U.S.C. 154(b) by 1009 days.

(21) Appl. No.: 16/681,620

(22) Filed: Nov. 12, 2019

(65) Prior Publication Data

US 2021/0028725 A1 Jan. 28, 2021

Related U.S. Application Data

(60) Provisional application No. 62/878,225, filed on Jul. 24, 2019.

(51) Int. Cl.
| | |
|---|---|
| *H02N 2/18* | (2006.01) |
| *B60B 27/00* | (2006.01) |
| *B60C 23/04* | (2006.01) |
| *B60C 7/00* | (2006.01) |
| *B60R 16/03* | (2006.01) |

(52) U.S. Cl.
CPC .......... *H02N 2/18* (2013.01); *B60B 27/0015* (2013.01); *B60C 23/0411* (2013.01); *B60C 23/0486* (2013.01); *B60C 7/00* (2013.01); *B60R 16/0307* (2013.01)

(58) Field of Classification Search
CPC ......... H02N 2/18; B60C 7/00; B60C 23/0411; B60C 23/0486; B60R 16/0307
See application file for complete search history.

(56) References Cited

U.S. PATENT DOCUMENTS

| | | | | |
|---|---|---|---|---|
| 4,504,761 | A | * 3/1985 | Triplett | .............. H02N 2/18 322/3 |
| 8,878,421 | B2 | 11/2014 | Kuisma et al. | |
| 2005/0285726 | A1* | 12/2005 | Haswell | .............. B60C 23/0493 340/445 |

(Continued)

FOREIGN PATENT DOCUMENTS

| | | |
|---|---|---|
| CN | 1886842 A | 12/2006 |
| CN | 101615652 B | 12/2012 |

(Continued)

OTHER PUBLICATIONS

Machine Translation of DE 102007010780 A1, 15 pages (Year: 2007).*

*Primary Examiner* — S. Joseph Morano
*Assistant Examiner* — Emily G. Castonguay
(74) *Attorney, Agent, or Firm* — Duane Morris LLP

(57) ABSTRACT

Systems and methods for an energy harvester proximate to a rotatable component of a vehicle's wheel are disclosed. In some embodiments, an energy harvester system includes: a substrate having a first surface configured to contact and interface with a surface of a wheel, and a second surface opposite the first surface; a piezoelectric component configured to produce energy in response to mechanical strain imparted on the piezoelectric component, wherein the piezoelectric component is configured to deform while experiencing the mechanical strain so as to contact at least a portion of the second surface.

20 Claims, 34 Drawing Sheets

(56) References Cited

U.S. PATENT DOCUMENTS

| | | |
|---|---|---|
| 2006/0022555 A1* | 2/2006 | Balasubramaniam ........................ B60C 23/0411 310/339 |
| 2007/0295069 A1 | 12/2007 | Mancosu |
| 2008/0079333 A1* | 4/2008 | Ulm .................... H02N 2/22 310/330 |
| 2009/0205435 A1* | 8/2009 | Buck .................. G01L 9/0022 73/753 |
| 2009/0211353 A1 | 8/2009 | Gao |
| 2011/0011172 A1 | 1/2011 | Schreiner |
| 2012/0326565 A1 | 12/2012 | Kuisma et al. |
| 2013/0181578 A1* | 7/2013 | Kameda ............ B60C 23/0411 310/339 |
| 2013/0229089 A1 | 9/2013 | Seppä |
| 2015/0020585 A1* | 1/2015 | Dussinger .............. B60C 23/04 73/146.5 |
| 2015/0188458 A1* | 7/2015 | Andosca ............... H02N 2/188 310/329 |
| 2016/0075189 A1* | 3/2016 | Engel ................. G06K 7/10366 340/438 |
| 2017/0040911 A1 | 2/2017 | Tatarchuk |
| 2017/0092018 A1* | 3/2017 | Throop .................. G07C 5/008 |
| 2017/0141703 A1 | 5/2017 | Jung |
| 2017/0239585 A1 | 8/2017 | Fontaine |
| 2018/0053889 A1 | 2/2018 | Ghanbari |

FOREIGN PATENT DOCUMENTS

| | | | |
|---|---|---|---|
| CN | 102192113 B | 7/2013 | |
| CN | 105082901 B | 6/2017 | |
| DE | 102007010780 A1 * | 12/2007 | ............. B60C 19/00 |
| JP | S60-13759 | 1/1985 | |
| JP | 2011-517396 A | 6/2011 | |
| JP | 2013-539339 A | 10/2013 | |
| JP | 2016-517684 A | 6/2016 | |
| JP | 2017-165399 A | 9/2017 | |
| WO | 2010119716 A1 | 10/2012 | |

\* cited by examiner

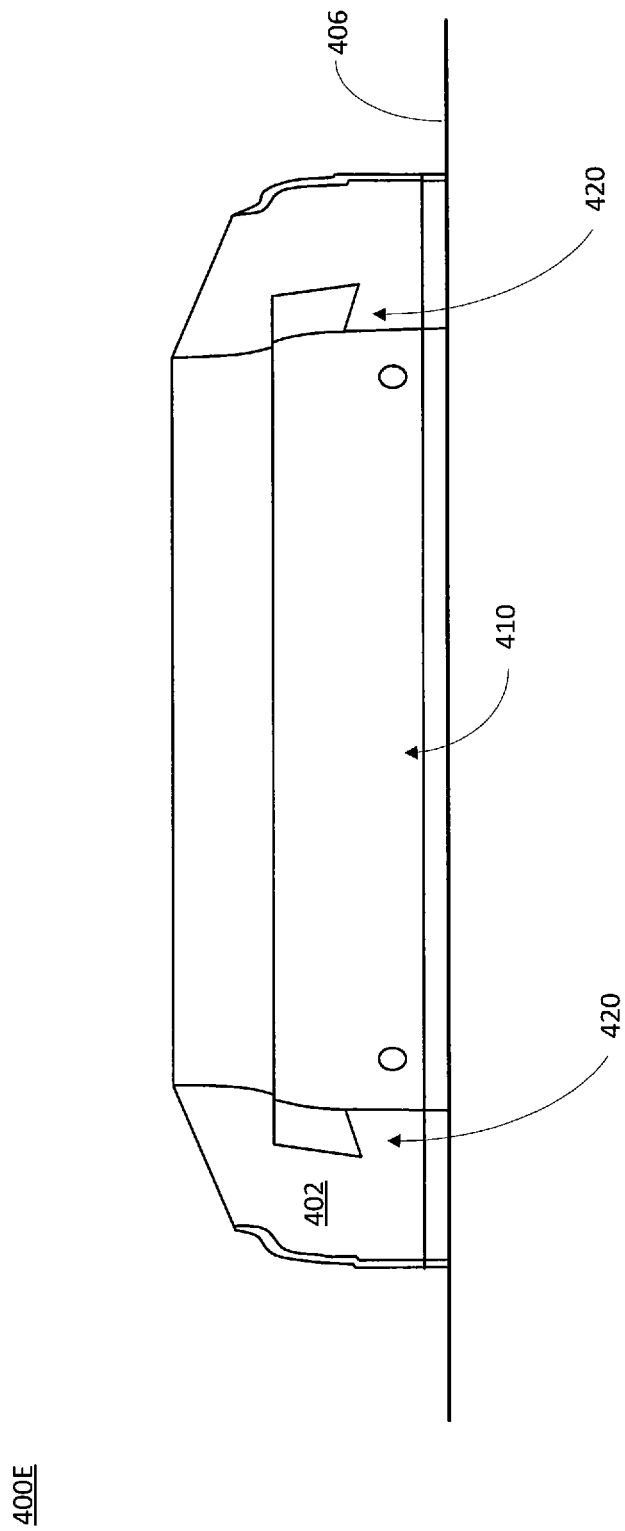

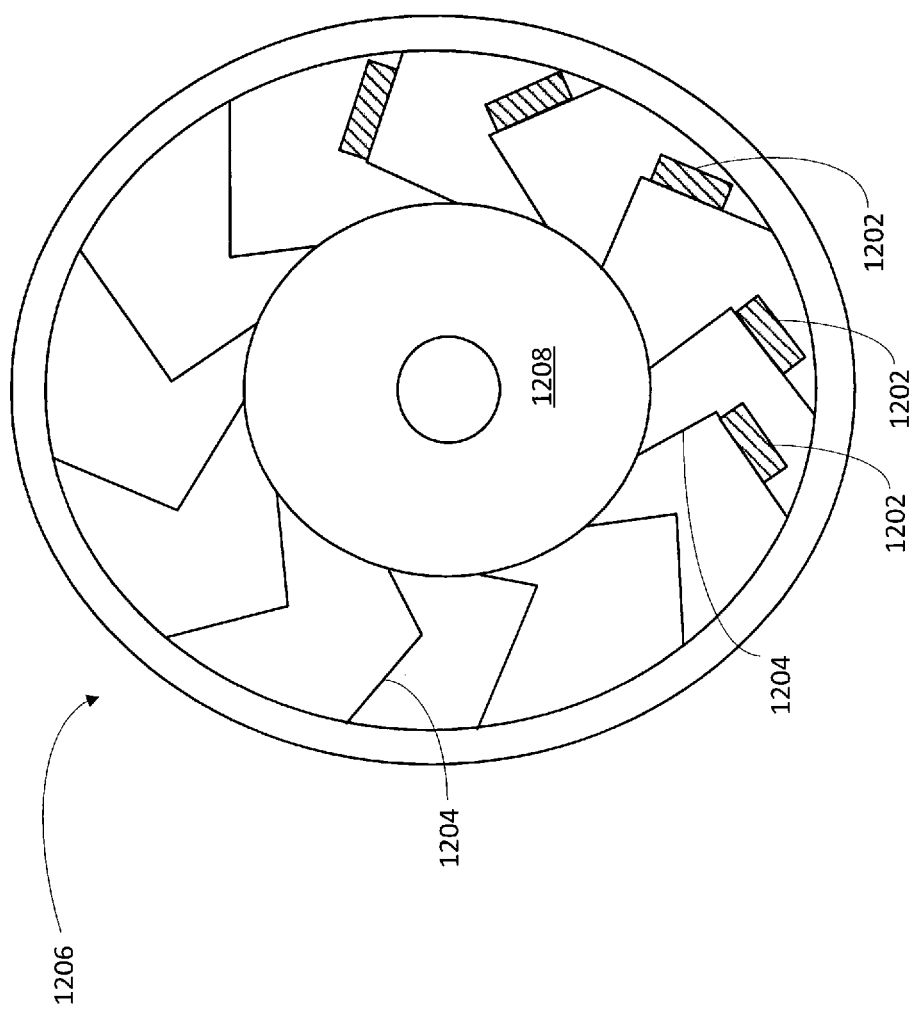

SMART WHEEL ENERGY HARVESTER

CROSS-REFERENCE TO RELATED APPLICATIONS

The present application claims priority benefit of U.S. Provisional Application No. 62/878,225, filed on Jul. 24, 2019, the contents of which are incorporated by reference in its entirety.

TECHNICAL FIELD

This application relates generally to sensor systems and, more particularly, relates to systems and methods for an energy harvester proximate to a rotatable component of a vehicle's wheel.

BACKGROUND

In the area of automotive sensor systems, the demand for advanced sensing applications to complement existing electronic safety systems has drawn considerable attention. This includes, for example, measurements of temperature, pressure, acceleration, and forces (static and dynamic) acting on a tire, wheel and car. All these sensors create an increased power demand to operate and transmit data more frequently. Current power sources (e.g., lithium ion batteries) driving these sensors are limited in their capacity and exhibit drawbacks such as low durability, difficulty of replacement, and most notably, inferior sustainability in terms of environmental impact. With increased power load, these power sources are further subjected to accelerated discharge cycles, resulting in frequent or premature replacement of entire sensor modules. This may increase the overall cost of ownership and maintenance to a user.

The foregoing examples of the related art and limitations related therewith are intended to be illustrative and not exclusive. Other limitations of the related art will become apparent upon a reading of the specification and a study of the drawings.

SUMMARY

The exemplary embodiments disclosed herein are directed to solving the issues relating to one or more of the problems presented in the prior art, as well as providing additional features that will become readily apparent by reference to the following detailed description when taken in conjunction with the accompanied drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the invention.

In certain embodiments, a system includes: a substrate comprising: a first surface curved in three dimensions, where the first surface is configured to interface with a rim of a wheel, and a second surface curved in at least two of the three dimensions; and a piezoelectric component configured to produce energy in response to mechanical strain, where the piezoelectric component is in contact with the wheel, and where the piezoelectric component is configured to deform and contact the second surface while experiencing the mechanical strain.

In certain embodiments, the piezoelectric component comprises multiple layers.

In certain embodiments, the piezoelectric component comprises: a tensile load backing layer, a piezoelectric material layer, and an electrode layer.

In certain embodiments, the electrode layer comprises an electrode configured to connect to an interconnect.

In certain embodiments, the electrode is formed as a mesh.

In certain embodiments, the electrode layer is closer to the second surface than the tensile load backing layer.

In certain embodiments, the piezoelectric material layer is between the tensile load backing layer and the electrode layer.

In certain embodiments, the three dimensions are along a length, a width, and a height of the substrate.

In certain embodiments, a system includes: a wheel comprising a staging surface curved in only two dimensions; and a piezoelectric component configured to produce energy in response to mechanical strain, where the piezoelectric component is flat and in contact with the wheel, and where the piezoelectric component is configured to deform and contact the staging surface while experiencing the mechanical strain.

In certain embodiments, the wheel includes a rim, where the staging surface is part of a depression along the rim.

In certain embodiments, the piezoelectric component comprises a piezoelectric material layer between two electrode layers.

In certain embodiments, the two electrode layers comprise different mesh structures.

In certain embodiments, the piezoelectric component is configured to conform with the staging surface while experiencing the mechanical strain.

In certain embodiments, the piezoelectric component comprises a piezoelectric material that is at least one of: a crystal and semiconductor material or a polymer and organic material.

In certain embodiments, the wheel comprises an airless tire and the staging surface is along a spoke of the airless tire.

In certain embodiments, a method includes: rotating a wheel, where the wheel comprises a staging surface curved in only two dimensions; deforming a piezoelectric component, where the piezoelectric component configured to produce energy in response to mechanical strain, where the piezoelectric component is flat and in contact with the wheel, and where the piezoelectric component is configured to deform and contact the staging surface while experiencing the mechanical strain; and powering a device located on the wheel using the energy.

In certain embodiments, the method further includes: receiving, at a processor located within a vehicle body, sensor data from the device, where the device is configured to produce sensor data while disposed on the wheel; determining a parameter value based on the sensor data; and performing an action based on the parameter value meeting a threshold value.

In certain embodiments, the parameter value is based on the sensor data and data received from a remote server.

In certain embodiments, the device is configured to send the sensor data to the processor via a wireless connection.

In certain embodiments, the piezoelectric component is configured to contact a surface on which the wheel is configured to rotate.

BRIEF DESCRIPTION OF THE DRAWINGS

Various exemplary embodiments of the invention are described in detail below with reference to the following Figures. The drawings are provided for purposes of illustration only and merely depict exemplary embodiments of the invention. These drawings are provided to facilitate the reader's understanding of the invention and should not be considered limiting of the breadth, scope, or applicability of the invention. It should be noted that for clarity and ease of illustration these drawings are not necessarily drawn to scale.

FIG. 4E is a bottom view illustration of the energy harvester, in accordance with various embodiments.

FIG. 12A illustrates an energy harvester disposed on a spoke of an airless tire, in accordance with various embodiments.

DETAILED DESCRIPTION OF EXEMPLARY EMBODIMENTS

Figure 1:
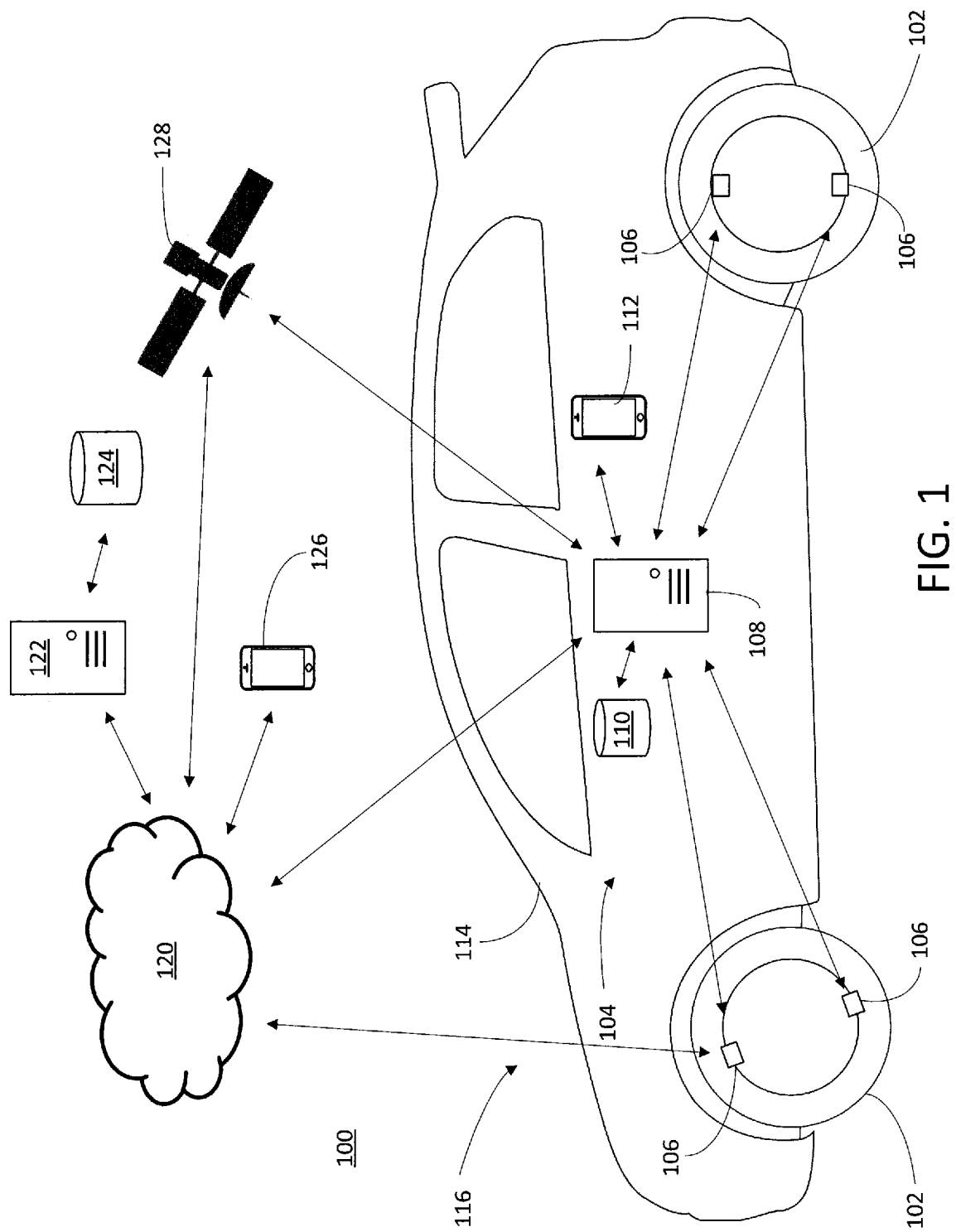
FIG. 1 is a diagram of a smart wheel sensor system that integrates at least one smart wheel, in accordance with various embodiments.

Various exemplary embodiments of the invention are described below with reference to the accompanying figures to enable a person of ordinary skill in the art to make and use the invention. As would be apparent to those of ordinary skill in the art, after reading the present disclosure, various changes or modifications to the examples described herein can be made without departing from the scope of the invention. Thus, the present invention is not limited to the exemplary embodiments and applications described and illustrated herein. Additionally, the specific order or hierarchy of steps in the methods disclosed herein are merely exemplary approaches. Based upon design preferences, the specific order or hierarchy of steps of the disclosed methods or processes can be rearranged while remaining within the scope of the present invention. Thus, those of ordinary skill in the art will understand that the methods and techniques disclosed herein present various steps or acts in a sample order, and the invention is not limited to the specific order or hierarchy presented unless expressly stated otherwise.

As noted above, batteries or other disposable energy sources powering vehicular sensor systems are limited in their capacity and exhibit drawbacks such as low durability, difficulty of replacement, and inferior environmental sustainability. An alternative to disposable batteries in vehicular sensor systems involves harvesting energy from the environment. Accordingly, new systems and methods utilizing energy harvesters for harvesting energy from an environment proximate to a wheel are disclosed herein, in accordance with various embodiments. These energy harvesters may be devices that transform energy from various sources such as kinetic energy, heat, light, and/or mechanical energy into usable electrical energy, in accordance with various embodiments. For example, an energy harvester may utilize piezoelectric transduction to transform tire deformations into electrical energy. This amount of energy transformation may vary based on a rotating speed of a wheel (e.g., a speed of the car as determined by a driver). Also, in certain embodiments, energy harvesters may be placed on a rim of a wheel for more effective energy capture.

In various embodiments, an energy harvester may produce sustained outputs at varying vehicle speeds based on the weight of the vehicle acting on an underlying surface (e.g., a road) through a rim and tire. For example, vehicles may have wheels (e.g., wheels with pneumatic tires). A wheel, with an inflated tire and rigid rim, can exchange vehicular actions along a bead area of the tire that interfaces with the rigid rim. These vehicular actions may include traction, braking, steering, load support, and the like. As the wheel rotates, the lower part of the tire may apply forces in the bead area to counter the weight of the car. These forces may cause sidewalls of the wheel to bend due to the internal air pressure of the tire (e.g., due to the intimate contact between a rubber tire and metal rim).

In various embodiments, an energy harvester may include a substrate and a piezoelectric component. The substrate may be placed behind (e.g., proximate to) the piezoelectric component to form a cavity that allows the force of the vehicle during motion (e.g., wheel rotation) to displace (e.g., strain or bend) the piezoelectric component and generate a charge (e.g., electrical energy). The energy harvester, as a piezo-substrate assembly, can then be arrayed around the circumference of the rim, generating continuous power as the wheel rotates. In certain embodiments when the energy harvester is mounted on the rim of the wheel, the energy harvester may be separate from the rim and/or the tire. Thus, the energy harvester need not be replaced or changed when the tire is replaced. The energy harvester may also be coupled with an energy storage device (e.g., a rechargeable battery) to provide recharge cycles that can supply power to an array of sensors placed in, on, or proximate to the wheel.

In some embodiments, a piezoelectric component may utilize strain (e.g., mechanical strain indicative of relative motion/deflection) to generate charge. Furthermore, the substrate may be structured to facilitate the expression of the strain (e.g., relative motion/deflection) of the piezoelectric component when placed between the tire and rim of a wheel.

In various embodiments, the substrate may include a geometry and be located in a power dense area of a wheel to increase strain (e.g., energy generation) from a piezoelectric component mounted on the substrate. Stated another way, an energy harvester may be a mechanism with a specific internal and external geometry sitting between a wheel and tire that transforms mechanical force (vehicle weight) and locomotion into usable strain generated on a piezoelectric component.

In certain embodiments, an energy harvester may harvest energy from mechanical loads exerted upon a wheel. For example, the load of the vehicle and the force exerted by the vehicle in the presence of a mechanical substrate may induce a strain on a piezoelectric component that produces substantial power which can be harnessed to power electronic or sensing systems in the vehicle and/or wheel.

This energy harvester, inclusive of the piezoelectric component and substrate in certain embodiments, may be modular and scaled to various wheel diameters, energy requirements, and sensor locations. In further embodiments, this substrate may encase and protect a piezoelectric component mounted on the substrate and other electronics from degradation due to exposure. In yet further embodiments, the energy harvester may include the piezoelectric component and a region of a wheel (e.g., a staging surface) configured or constructed to induce strain upon the piezoelectric component.

In various embodiments, the substrate may include a three-dimensional curved bottom surface that interfaces with a rim (e.g., a rotatable component of a wheel separate from a tire (e.g., a flexible component) of a wheel). This three-dimensional curved bottom surface may include a compound curve in three dimensions (e.g., length, height, and width). Each of the length, height, and width may define dimensions or axes orthogonal to each other in three dimensional physical space. For example, the length may be along an axis orthogonal to the height, which may be along an axis orthogonal to the width, which may be along an axis orthogonal to the length. In certain embodiments, the length, height, and width may be referred to as an x-axis, a z-axis, and a y-axis. Also, the substrate may include a two-dimensional (e.g., two of a length, a height and a width) curved staging surface (e.g., a micro cavity or depression) opposite a bottom surface of the substrate. In certain embodiments, this two dimensional curved staging surface may be curved in a convex or concave manner and the piezoelectric component may incur strain to deform and conform to the two dimensional curved staging surface. Accordingly, the rectangular piezoelectric component may be configured to bend and conform to the two dimensional curved staging surface while sitting on the rim via the three-dimensional curved bottom surface (e.g., by being secured on the substrate with the three-dimensional curved bottom surface).

In certain embodiments, the piezoelectric component may be formed with multiple layers. For example, the piezoelectric component may include a tensile load backing layer. This tensile load backing layer may be, for example, a steel plate with sufficient tensile load flexibility to keep the piezoelectric component together. The piezoelectric component may further include a central piezoelectric material layer that may be configured to generate electrical charge when it is mechanically deformed. The piezoelectric component may further include an electrode layer that may be formed as a mesh with the central piezoelectric material layer to more effectively harvest electrical charge from the central piezoelectric material layer. In particular embodiments, an electrode layer may include an electrode embedded within (e.g., held in place by) a flexible material (e.g., epoxy) and in direct or indirect contact with the piezoelectric material layer.

In certain embodiments, an electrode layer may include a flexible interconnect with an electrode. Also, the electrode layer may contain a flexible material that keeps the electrode and flexible interconnect in place. This flexible interconnect may be configured to electrically connect the electrode in the electrode layer to other electrical components (e.g., a pressure sensor) coupled to the wheel in order to provide power to the other electrical components or for the other electrical components to perform measurements based on signals received from the flexible interconnect.

In certain embodiments, this lower electrode layer may be closest to the staging surface and may touch the staging surface when the piezoelectric component is biased (e.g., strained or deformed) to conform to the two-dimensional curved staging surface. Accordingly, the central piezoelectric material layer may be sandwiched (e.g., in between) the lower electrode layer and the tensile load backing layer. In particular embodiments, the piezoelectric component may be referred to as a piezoelectric element.

In certain embodiments, the piezoelectric component may include three layers, including a tensile load backing layer, which is connected to a central piezoelectric material layer, which is connected to a lower electrode layer. In various embodiments, the electrode layer may be associated with two independent circuits (e.g., so that the lower electrode layer may represent a difference in voltage potential between the two independent circuits) when the piezoelectric component includes only a single electrode layer. In particular embodiments, the lower electrode layer may be closest to the staging surface among the layers of the piezoelectric component. However, in other embodiments, the tensile load backing layer may be closest to the staging surface among the layers of the piezoelectric component.

In specific embodiments, an upper electrode layer may be formed on (e.g., adhered to) the tensile load backing layer. For example, the upper electrode layer may be the furthest from the staging surface and the lower electrode layer may be the closest to the staging surface among the layers of the piezoelectric component. In particular embodiments, this upper electrode layer may also be formed as a mesh on the tensile load backing layer to harvest electrical charge from the piezoelectric material layer (e.g., via the tensile load backing layer between the upper electrode layer and the piezoelectric material layer). Accordingly, the piezoelectric component in certain embodiments may include four layers, with an upper electrode layer, which is connected with a tensile load backing layer, which is connected with a central piezoelectric material layer, which is connected with a lower electrode layer. Although certain embodiments may describe the lower electrode layer as closest to the staging surface among the layers of the piezoelectric component, other embodiments may describe the upper electrode layer as closest to the staging surface among the layers of the piezoelectric component. In certain embodiments, the piezoelectric component may also be referred to as a piezoelectric electrode assembly. In various embodiments, a piezoelectric component may include two electrode layers that may have a relative electric potential difference between each other.

In particular embodiments, the tensile load backing layer may be electrically and mechanically bonded to a piezoelectric material layer. As noted above, the tensile load backing layer may be made of stainless steel. Also, the piezoelectric material layer may be referred to as a piezoelectric wafer in certain embodiments. Also, the top electrode layer and the bottom electrode layer may be electrically bonded to the tensile load backing layer and piezoelectric material layer, respectively. For example, the top electrode layer may be electrically bonded to the tensile load backing layer and the bottom electrode layer may be electrically bonded to the piezoelectric material layer.

In various embodiments, a piezoelectric component may be assembled against a convex surface of a substrate. As noted above, the substrate may include a two-dimensional curved staging surface. This two-dimensional curved staging surface may include a convex surface to which the piezoelectric component, with a straight (e.g., non-curved or flat) shape or surface when in a resting state, may be attached. When a strain or force is applied to the piezoelectric component, it will bend and conform to the two-dimensional curved staging surface. In certain embodiments, the substrate may be referred to as a teardrop support. Also, in various embodiments, a piezoelectric component may be attached to the convex surface of the substrate in a manner such that the piezoelectric material layer is closer to the substrate than the tensile load backing layer. Stated another way, piezoelectric component may be attached to the convex surface of the substrate such that the piezoelectric material layer is facing down toward the convex surface.

In various embodiments, a piezoelectric component may be bent against the convex surface to generate compressive bending strain on the piezoelectric component. Stated another way, the piezoelectric component may incur strain such that the piezoelectric component is bent to conform to the convex surface to generate electrical charge (e.g., via piezoelectric material layer mechanical deformation). Accordingly, the substrate may be structured to enable a strain (e.g., relative motion/deflection) of the piezoelectric component when placed between the tire and rim of a wheel (e.g., by the tire pushing down against the piezoelectric component).

The mesh formation of an electrode layer (e.g., an upper electrode layer and/or lower electrode layer) may be in any configuration or structure, such as by being simply connected (e.g., without any openings or holes) in certain embodiments or by not being simply connected (e.g., with openings or holes) in other embodiments. In particular embodiments, the mesh formation of the electrode layer may be a single elongated electrode that traverses a two-dimensional space (e.g., along a surface of another layer of the piezoelectric component). Accordingly, the electrode layer may be a layer of the piezoelectric component that includes an electrode generally held in place by a flexible material (e.g., an epoxy) and is connected with a flexible interconnect. In alternative embodiments, an electrode layer (e.g., an upper electrode layer and/or lower electrode layer) may be monolithic (e.g., be a solid layer of electrode coextensive with a surface of another layer of the piezoelectric component). In further embodiments, different electrode layers may include different mesh formations. In yet further embodiments, different electrode layers may include the same mesh formations.

In various embodiments, the piezoelectric component may be adapted to incur strain (e.g., generate energy) in any type of wheel in which force (e.g., to produce strain) is applied during rotation. Examples of different types of wheels may include wheels with an air-inflated tire, wheels with an airless tire (e.g., a non-pneumatic or flat-free tire), wheels that are cylindrical, and wheels that are spherical. In additional embodiments, a piezoelectric component may be adhered directly to a wheel (e.g., without a substrate) to incur strain and deform along with portions of the wheel which may deform in response to a load. For example, a piezoelectric component may be adhered along an outer surface of a spherical tire, adhered along a spoke of an airless tire, or adhered to any other component of a wheel that may deform in response to a load.

Although certain embodiments may reference piezoelectric components with a particular number of layers in a particular order, it can be noted that piezoelectric components may include any number of layers in any order as desired for different applications in various embodiments. For example, a piezoelectric component may include four layers with a tensile load backing layer connected to an upper electrode layer, which is connected to a piezoelectric material layer, which is connected to a lower electrode layer.

In various embodiments, the piezoelectric component may include a piezoelectric material that is at least one of a crystal and semiconductor material or a polymer and organic material. Examples of a crystal and semiconductor material may include: polyvinylidene fluoride, gallium phosphate, sodium bismuth titanate, lead zirconate titanate, quartz, berlinite (AlPO4), sucrose (table sugar), rochelle salt, topaz, tourmaline-group minerals, lead titanate (PbTiO3), langasite (La3Ga5SiO14), gallium orthophosphate (GaPO4), lithium niobate (LiNbO3), lithium tantalate (LiTaO3), any of a family of ceramics with perovskite, tungsten-bronze, potassium niobate (KNbO3), sodium tungstate (Na2WO3), Ba2NaNb5O5, Pb2KNb5O15, sodium potassium niobate ((K,Na)NbO3) (e.g., NKN, or KNN), bismuth ferrite (BiFeO3), sodium niobate (NaNbO3), barium titanate (BaTiO3), bismuth titanate (Bi4Ti3O12), sodium bismuth titanate (NaBi(TiO3)2), zincblende crystal, GaN, InN, AlN, and ZnO. Examples of a polymer and organic material may include: polyvinylidene fluoride (PVDF) and its copolymers, polyamides, and paralyne-C, polyimide and polyvinylidene chloride (PVDC), and diphenylalanine peptide nanotubes (PNTs).

In various embodiments, the substrate may include at least one material such as: brass, steel, spring steel sheet (SS), carbon fiber, aluminum and its alloys, titanium and its alloys, S2 fiberglass rods, glass fiber reinforced polymer laminate (Fiberite HMS/33), fiberglass, kevlar laminate, carbon fiber reinforced materials, aramid fiber reinforced materials, fiber-reinforced plastic (FRP), copper, and alloys.

In various embodiments, an energy harvester may be part of a smart wheel sensor system to provide power for least one sensor of the smart wheel sensor system. For example, the energy harvester may be arrayed on a wheel of a vehicle (e.g., a wheel driven object) along with other sensors of the smart wheel sensor system. The smart wheel sensor system may include multiple types of sensors, which may each be configured to collect different types of smart wheel sensor system data. For example, the smart wheel sensor system may include a height sensor configured to produce barometric pressure sensor data; an acoustic sensor configured to produce acoustic sensor data; an image sensor configured to produce image sensor data; a gas sensor configured to produce gas sensor data; a magnetic sensor configured to produce magnetic sensor data; an accelerometer sensor configured to produce acceleration sensor data; a gyroscope sensor configured to produce gyroscopic sensor data; and a humidity sensor configured to produce humidity sensor data. The smart wheel sensor system data produced by the smart wheel sensor system may be centrally and locally analyzed at a vehicle that relies upon the smart wheel for movement (e.g., by a computer or server within or supported by the vehicle's body) to determine a status of the vehicle and/or an individual smart wheel. Advantageously, the smart wheel sensor system may be implemented in an autonomous vehicle, such as part of a backup sensor system to augment the autonomous vehicle's safety system. In various embodiments, an individual wheel on which devices of a smart wheel sensor system are arrayed may be referred to as a smart wheel.

FIG. 1 is a diagram of a smart wheel sensor system 100 that integrates at least one smart wheel 102, in accordance with various embodiments. The smart wheel sensor system 100 may include a local sensor system 104 (e.g., a local smart wheel sensor system) with a device platform 106 arrayed on respective smart wheels 102. The device platform 106 may represent devices on a smart wheel, such as an energy harvester and/or sensor powered by an energy harvester.

This local sensor system 104 may include a local smart wheel server 108 that communicates with the sensors within the device platform 106. Accordingly, each device platform 106 may include at least one sensor and also include ancillary interfaces, such as communication interfaces, for communication with the local smart wheel server 108. This local smart wheel server 108 may also be in communication with a local smart wheel datastore 110 and any local user devices 112, such as a smartphone. For ease of explanation, the term local may refer to devices that are bound within or on a vehicle body 114 or a smart wheel 102 of a vehicle 116.

In contrast, the term remote may refer to devices that are outside of the vehicle body 114 or smart wheel 102 of the vehicle 116. For example, the local smart wheel server 108 may be configured to communicate with a remote network 120, such as the Internet. This remote network 120 may further connect the local smart wheel server 108 with remote servers 122 in communication with remote datastores 124 or remote user devices 126. In addition, the local smart wheel server 108 may be in communication with external sensors or devices, such as a remote satellite 128 for global positioning system (GPS) information.

In various embodiments, at least some of the devices of the device platform 106 may be configured to communicate with the local smart wheel server 108 via a communications interface. This communications interface may enable devices to communicate with each other using any communication medium and protocol. Accordingly, the communications interface 280 may include any suitable hardware, software, or combination of hardware and software that is capable of coupling the device platform 106 with the local smart wheel server 108. The communications interface may be arranged to operate with any suitable technique for controlling information signals using a desired set of communications protocols, services or operating procedures. The communications interface may comprise the appropriate physical connectors to connect with a corresponding communications medium. In certain embodiments, this communications interface may be separate from a controller area network (CAN) bus. For example, the communications interface may facilitate wireless communications within the local sensor system 104 (e.g., between the device platforms 106 and the local smart wheel server 108). Further discussion of such a communications interface is provided in greater detail below.

In certain embodiments, at least some of the devices of the device platform 106 may be configured to communicate with the remote network 120. For example, sensor data produced by a sensor of the device platform 106 may be communicated to the remote servers 122, the remote datastores 124, the remote user devices 126, and/or the remote satellite 128 via the remote network 120. In various embodiments, certain devices of the device platform 106 may communicate directly with the remote network 120. For example, certain devices of the device platform 106 may include communication interfaces (discussed further below) that may be configured to communicate directly with the remote network 120 in a manner that bypasses the local server 108. In other embodiments, certain devices of the device platform 106 may communicate indirectly with the remote network 120. For example, certain devices of the device platform 106 may include communication interfaces (discussed further below) that may be configured to communicate indirectly with the remote network 120 via the local server 108, which includes one or more communication interfaces (discussed further below) to communicate with external devices via various communication protocols (e.g., LTE, 5G, etc.), as discussed in further detail below.

These communications from the device platform 106 to the remote server 122, whether direct or indirect, may include sensor data collected by the device platform for analysis by the remote server 122. This sensor data may be analyzed by the remote server 122 to determine an action that may be performed by the local server 108, in accordance with various embodiments. For example, as will be discussed in further detail below, this sensor data may be utilized to determine a parameter value. Then certain actions may be performed based on the state of the parameter value, such as in response to the parameter value meeting certain threshold values (e.g., an alert or notification presented via a user interface). This determination of a parameter value may be performed at the remote server 122 and then the parameter values communicated to the local server 108 to determine the action to be performed based on the state of the parameter value. In other embodiments, both the determination of a parameter value and the determination of the resultant action may be performed by the remote server 122. Then the remote server 122 may communicate an indication of the action to be performed to the local server 108 for implementation (e.g., as an instruction to the local server 108 for implementation). Although certain embodiments describe sensor data as being communicated to a remote server for processing, sensor data may be processed in other manners as desired for different applications in accordance with various embodiments. For example, the sensor data may be processed locally at the local server 108 with or without additional inputs provided from the remote server 122, remote user device 126, and/or remote satellite 128, as will be discussed further below. In some embodiments, the device platform 106 may communicate directly with the user device 112 (e.g., a smartphone) which can then communicate directly or indirectly with the local server 108, remote network 120, remote user device 126 and/or remote satellite 128. In further embodiments, the wheel 102 (e.g., serving as an antenna) and/or the sensor platform 106 may have a direct communication link with the remote user device 126 or remote satellite 128 (e.g., for purposes of internet access and/or GPS applications).

Figure 2:
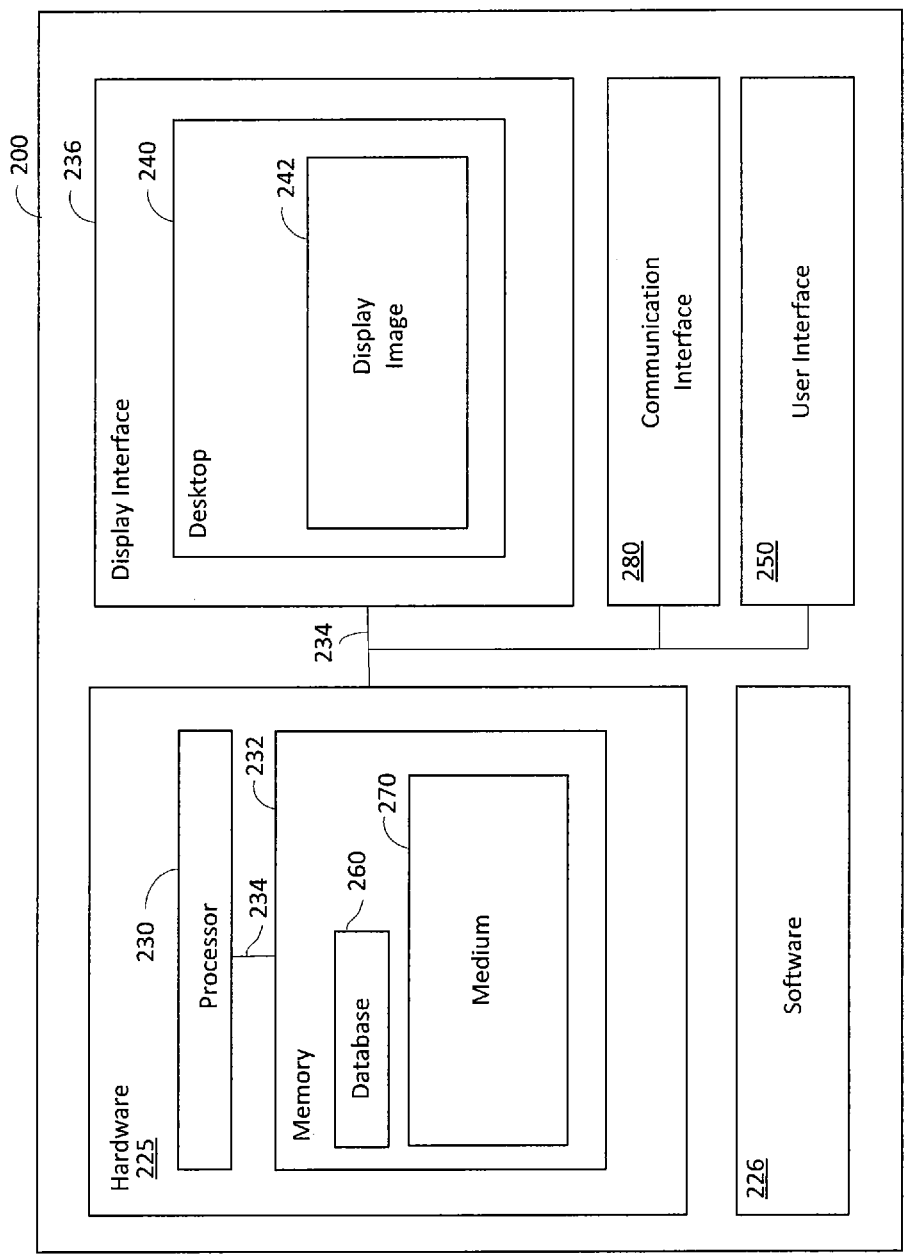
FIG. 2 is a block diagram of an exemplary computing device, in accordance with various embodiments.

FIG. 2 is a block diagram of an exemplary computing device 200, in accordance with various embodiments. As noted above, the computing device 200 may represent exemplary components of a particular local smart wheel server 108, local user device 112, remote server 122, remote user device 126, certain devices of a device platform 106 (e.g., a sensor of the device platform), or remote satellite 128 as discussed above in connection with FIG. 1. Returning to FIG. 2, in some embodiments, the computing device 200 includes a hardware unit 225 and software 226. Software 226 can run on hardware unit 225 (e.g., the processing hardware unit) such that various applications or programs can be executed on hardware unit 225 by way of software 226. In some embodiments, the functions of software 226 can be implemented directly in the hardware unit 225 (e.g., as a system-on-a-chip, firmware, field-programmable gate array ("FPGA"), etc.). In some embodiments, the hardware unit 225 includes one or more processors, such as processor 230. In some embodiments, processor 230 is an execution unit, or "core," on a microprocessor chip. In some embodiments, processor 230 may include a processing unit, such as, without limitation, an integrated circuit ("IC"), an application specific integrated circuit (ASIC), a digital signal processor (DSP), an attached support processor (ASP), a microcomputer, a programmable logic controller ("PLC"), and/or any other programmable circuit. Alternatively, processor 230 may include multiple processing units (e.g., in a multi-core configuration). The above examples are exemplary only, and, thus, are not intended to limit in any way the definition and/or meaning of the term "processor." Hardware unit 225 also includes a system memory 232 that is coupled to processor 230 via a system bus 234. Memory 232 can be a general volatile RAM. For example, hardware unit 225 can include a 32 bit microcomputer with 2 Mbit ROM and 64 Kbit RAM, and/or a number of GB of RAM. Memory 232 can also be a ROM, a network interface (NIC), or any combination of known volatile and/or non-volatile memory devices with appropriate capacities for various desired applications, in accordance with various embodiments.

In some embodiments, the system bus 234 may couple each of the various system components together. It should be noted that, as used herein, the term "couple" is not limited to a direct mechanical, communicative, and/or an electrical connection between components, but may also include an indirect mechanical, communicative, and/or electrical connection between two or more components or a coupling that is operative through intermediate elements or spaces. The system bus 234 can be any of several types of bus structure (s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

In some embodiments, optionally, the computing device 200 can also include at least one media output component or display interface 236 for use in presenting information to a user. Display interface 236 can be any component capable of conveying information to a user and may include, without limitation, a display device (not shown) (e.g., a liquid crystal display ("LCD"), an organic light emitting diode ("OLED") display, or an audio output device (e.g., a speaker or headphones). In some embodiments, computing device 200 can provide at least one desktop interface, such as desktop 240. Desktop 240 can be an interactive user environment provided by an operating system and/or applications running within computing device 200, and can include at least one screen or display image, such as display image 242. Desktop 240 can also accept input from a user in the form of device inputs, such as keyboard and mouse inputs. In some embodiments, desktop 240 can also accept simulated inputs, such as simulated keyboard and mouse inputs. In addition to user input and/or output, desktop 240 can send and receive device data, such as input and/or output for a FLASH memory device local to the user, or to a local printer.

In some embodiments, the computing device 200 includes an input or a user interface 250 for receiving input from a user. User interface 250 may include, for example, a keyboard, a pointing device, a mouse, a stylus, a touch sensitive panel (e.g., a touch pad or a touch screen), a position detector, and/or an audio input device. A single component, such as a touch screen, may function as both an output device of the media output component and the input interface. In some embodiments, mobile devices, such as tablets, can be used.

In some embodiments, the computing device 200 can include a database 260 as a datastore within memory 232, such that various information can be stored within database 260. Alternatively, in some embodiments, database 260 can be included within a remote server (not shown) with file sharing capabilities, such that database 260 can be accessed by computing device 200 and/or remote end users. In some embodiments, a plurality of computer-executable instructions can be stored in memory 232, such as one or more computer-readable storage mediums 270 (only one being shown in FIG. 2). Computer-readable storage medium 270 includes non-transitory media and may include volatile and nonvolatile, removable and non-removable mediums implemented in any method or technology for storage of information such as computer-readable instructions, data structures, program modules or other data. The instructions may be executed by processor 230 to perform various functions described herein.

In the example of FIG. 2, the computing device 200 can be a communication device, a storage device, or any device capable of running a software component. For non-limiting examples, the computing device 200 can be but is not limited to a local smart wheel server, a local user device, a remote server, a remote user device, a device of the device platform, a remote satellite, a smartphone, a laptop PC, a desktop PC, a tablet, a Google™ Android™ device, an iPhone®, an iPad®, and a voice-controlled speaker or controller.

The computing device 200 has a communications interface 280, which enables the computing device 200 to communicate with the user and other devices using one or more known communication mediums and communication protocols. Here, the communication mediums and protocols can be but are not limited to, the Internet, an intranet, a wide area network (WAN), a local area network (LAN), a wireless network, Bluetooth, WiFi, and a mobile communication network.

In some embodiments, the communications interface 280 may include any suitable hardware, software, or combination of hardware and software that is capable of coupling the computing device 200 to one or more networks and/or additional devices. The communications interface 280 may be arranged to operate with any suitable technique for controlling information signals using a desired set of communications protocols, services or operating procedures. The communications interface 280 may comprise the appropriate physical connectors to connect with a corresponding communications medium, whether wired or wireless. In some embodiments, the communications interface 280 includes radio frequency (RF) communications circuitry and at least one antenna for transmitting and receiving RF signals in accordance with various known communication protocols (e.g., LTE, 5G, Wifi, etc.).

A communications network may be utilized as a means of communication. In various aspects, the network may comprise local area networks (LAN) as well as wide area networks (WAN) including without limitation the Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., communication nodes) that utilize, at least in part, wireless technology including various protocols and combinations of protocols associated with wireless transmission, data, and devices. The communication nodes can include, for example, wireless devices such as mobile terminals, stationary terminals, base stations, access points, smartphones, and other known devices capable wireless communications via various wireless communication protocols. Further examples of communication nodes can include wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fibre Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 280 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 280 may comprise a wireless interface comprising (e.g., including) one or more antennas, transmitters, receivers, transceivers, amplifiers, filters, control logic, and so forth.

In various aspects, the communications interface 280 may provide data communications functionality in accordance with a number of protocols. Examples of protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1xRTT, EDGE systems, EV-DO systems, EV-DV systems, HSDPA systems, 4G-LTE, 5G (new radio) and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

Figure 3A:
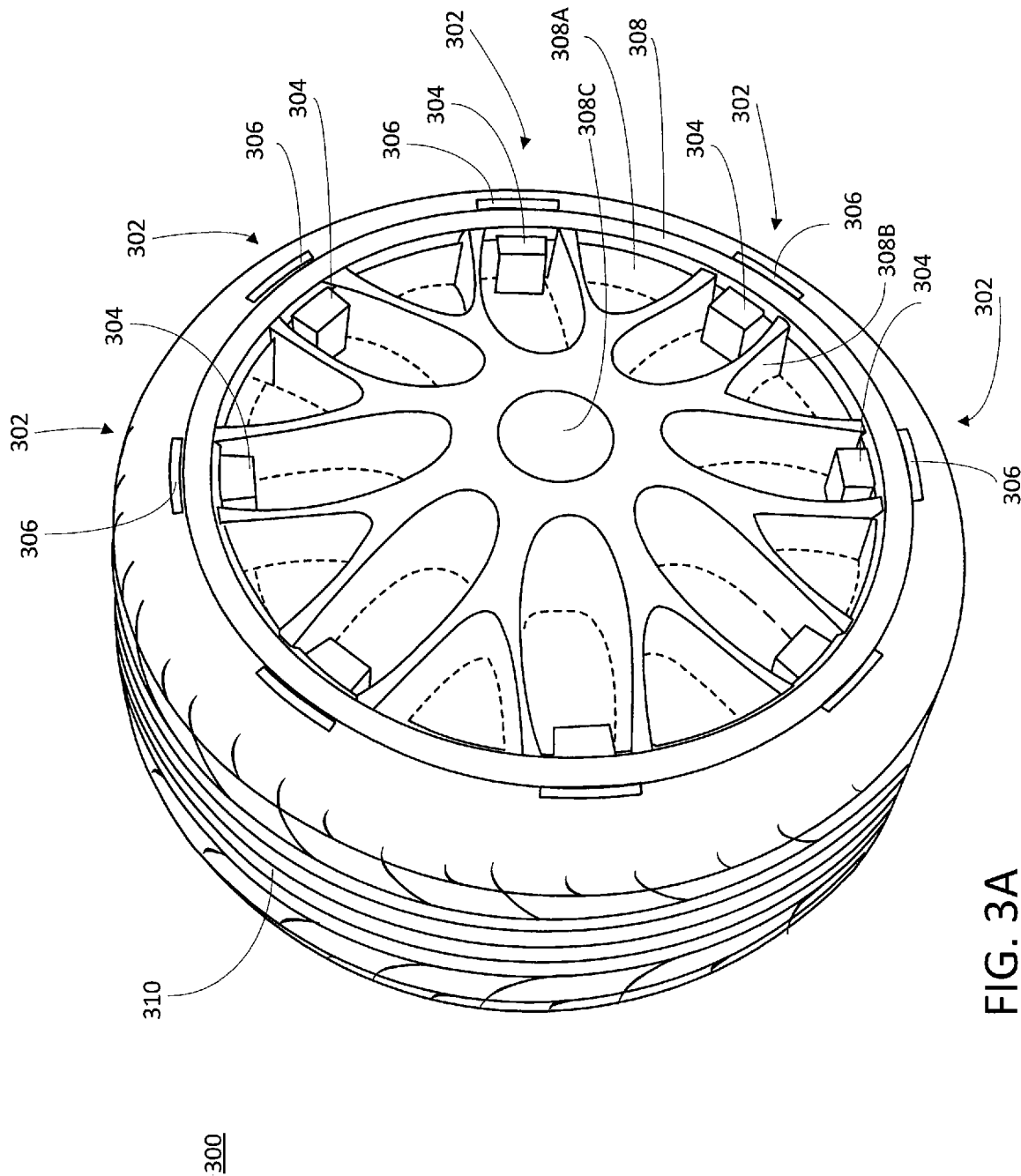
FIG. 3A is a perspective illustration of a smart wheel, in accordance with various embodiments.

FIG. 3A is a perspective illustration of a smart wheel 300, in accordance with various embodiments. The smart wheel 300 may include a device platform 302 of at least one device. More specifically, the device platform 302 may include at least one device that is a sensor within the sensor housing 304 and at least one device that is an energy harvester 306. The device platform may be supported by (e.g., be positioned along) a rotatable component 308 of the smart wheel 300. The rotatable component 308 may include, for example, a rim of the smart wheel 300 within which a circumference of the rotatable component 308 is bound. Although the device platform is illustrated as eight pairs of sensor housings 304 and energy harvesters 306, any number of sensor housings and energy harvesters may be implemented in a device platform as desired for different applications in various embodiments. For example, other embodiments may include multiple sensor housings for each energy harvester and yet further embodiments may include multiple energy harvesters for each sensor housing. Although certain embodiments describe the sensor housing 304 as being located directly on a rim 308A of the smart wheel 300 (e.g., on the rim of the rotatable component 308 of the smart wheel 300), the sensor housing may also be located in other parts of a smart wheel 300 as desired for different applications in various embodiments. For example, the sensor housing (and the constituent sensors) may be located closer to the center of the rotatable component 308, such as along the spokes 308B of the rotatable component 308 or around the center 308C (e.g., proximate a cap) of the rotatable component 308 in particular embodiments.

In various embodiments, the sensor housing may represent one or more sensors together within the sensor housing along with functional modules such as, for example, a battery or other energy storage medium configured to store energy produced by the energy harvester. In certain embodiments, the sensor housing may include a system bus (e.g., a conductive element of a printed circuit board) that connects the various portions of the sensor housing together.

Furthermore, the sensor housing may include other functional modules, such as a communications interface to communicate the sensor data captured by the various sensors of the sensor housing to a local smart wheel server. This communications interface may include, for example, a communications interface for data offload (e.g., via millimeter and/or gigahertz wavelength communications) to a local smart wheel server, to other vehicles, an infrastructure (e.g., a remote network) and/or user devices. As a further example, this communication interface may facilitate wireless communications, such as via Bluetooth, radio frequency, radio wave, ultrasonic, and/or any other type of communication protocol or medium. This communication interface may be configured to communicate with, for example, on board electronic control units (ECUs) and/or advanced driver-assistance (ADAS) systems on a vehicle. Additionally, the sensor housing, optionally, may include a processor or any other circuitry to facilitate the collection, communication, and/or analysis of sensor data produced by the constituent sensors of the sensor housing.

Various types of sensors may be integrated with the sensor housing, in accordance with various embodiments. For example, the sensor housing may include a shock sensor that may sense an amount of electric potential produced by the energy harvester. The shock sensor may be configured to wake up, or otherwise activate the sensors and/or functional modules of the sensor housing when a sufficient amount of electric potential is produced by the energy harvester. Stated another way, the shock sensor may conceptually include the energy harvester such that the shock sensor is configured to transition various sensors and/or functional modules of the sensor housing from a low power or inactive state to a powered on or active state based on the energy harvester producing more than a threshold amount of energy in response to mechanical deformation. In certain embodiments, the energy sensed by the shock sensor may be stored in a battery for standby power when the energy harvester is not producing any energy (e.g., when there is no mechanical stress applied to the energy harvester).

In particular embodiments, the sensor housing may include a height sensor configured to produce barometric pressure sensor data. Accordingly, this height sensor may be a barometric sensor or a barometric air pressure sensor that may measure atmospheric pressure, which may be indicative of an altitude or height. This barometric pressure sensor data may be utilized, for example, to determine a height of a smart wheel from a point of reference such as a road and/or relative to other smart wheels of a vehicle. This may allow for determination of roll over risk or a flat tire. As noted above, height sensors on a smart wheel may be on a rotatable component of a wheel and thus not on a chassis of a vehicle.

Thus, such height sensors may be able to provide barometric pressure sensor data on which side (e.g., which smart wheel) initiated a roll over (e.g., when such barometric pressure sensor data is produced and recorded in a continuous or semi continuous manner). Furthermore, road conditions, such as pot holes, can be more accurately sensed by barometric sensor data produced by a smart wheel, in comparison to sensor data produced from a static part of a chassis of a vehicle. In some embodiments, the height sensor is configured to also measure a deflection of an inner tire surface due to vehicle loads or a contact patch. In some embodiments, a distance measuring sensor can be placed into the pressurized portion of a tire. As the tire rotates, the distance of the tire relative to the central rotating rim changes. This periodic change of distance is detectable.

In further embodiments, the sensor housing may include an acoustic sensor configured to produce acoustic sensor data. Accordingly, this acoustic sensor may be any type of acoustic, sound, or vibrational sensor such as a geophone, a microphone, a seismometer, and a sound locator, and the like. The acoustic sensor data may be utilized for audio pattern recognition, such as to sense an audio signature of a brake or a rotor of a rotatable component (e.g., a wheel). This may be used for predicting a vehicle servicing schedule and/or to produce performance optimization data. In some embodiments, the acoustic sensor data may be analyzed to identify and/or monitor for unique signatures for different breaking and wear out conditions, for example.

In various embodiments, the sensor housing may include an image sensor configured to produce image sensor data from variable attenuation of waves. Examples of image sensors may include are semiconductor charge-coupled devices (CCD) or active pixel sensors in complementary metal-oxide-semiconductor (CMOS) or N-type metal-oxide-semiconductor (NMOS) technologies. In various embodiments, a device platform that includes an image sensor may include a lens, or other transparent medium on which the light waves are focused from outside of the sensor housing onto the image sensor. In particular embodiments, this image sensor may include a time of flight (TOF) sensor to capture time of flight data that may characterize a TOF. This TOF sensor may be, for example, an ultrasonic TOF sensor configured to collect ultrasonic TOF sensor data. As a more specific example, an image sensor may function as a camera for determination of a visibility of tire tread depth for assessment of tire performance and optimization. Such an image sensor that captures image data characterizing a tire tread depth may also be positioned in a manner such that image data of a tire tread may be captured (e.g., by having such an image sensor capture image data characterizing a tread depth of a smart tire that the image sensor is located on, or of a tire that the image sensor is not located on). In accordance with various embodiments, the location of the image sensor can be either inside or outside of the rim such that the sensor can image the sidewall of the tire. In either case, the image sensor can be electrically coupled to the energy harvester. As another specific example, an image sensor may include an infrared image sensor for authentication or identification. This infrared sensor may be utilized, for example, to scan for characteristics of a local environment or local object (e.g., a person approaching a vehicle) for authentication.

In particular embodiments, the sensor housing may include a gas sensor configured to produce gas sensor data. This gas sensor may be any type of sensor to monitor and characterize a gaseous atmosphere. For example, the gas sensor may utilize any of a variety of mechanisms for gas detection, such as an electrochemical gas sensor, a catalytic bead gas sensor, a photoionization gas sensor, an infrared point gas sensor, a thermographic gas sensor, a semiconductor gas sensor, an ultrasonic gas sensor, a holographic gas sensor, and the like. These gas sensors may, for example detect for certain types of gases, such as exhaust gases, explosive gases (e.g., for battery failure detection), atmospheric humidity, air quality, particulates, a pH level, and the like.

In particular embodiments, the sensor housing may include a magnetic sensor configured to produce magnetic sensor data. This magnetic sensor maybe, for example, a magnetometer that measures magnetism for navigation using magnetic field maps (e.g., inside a building or within a closed environment).

In additional embodiments, the sensor housing may include an accelerometer sensor configured to produce acceleration sensor data and/or a gyroscope sensor configured to produce gyroscopic sensor data. This acceleration sensor data and/or gyroscopic sensor data may be utilized for navigation, such as to determine an amount of acceleration for the application of emergency brake systems. In certain embodiments, the accelerometer sensor and/or gyroscope sensor may be part of an inertial navigation system (INS) located on a smart wheel.

The energy harvester 306 may be positioned along the rotatable component 308 (e.g., a rim) of the smart wheel 300 in a manner configured to capture a kinetic energy in response to a compressive force acting on a flexible component 310 (e.g., a pneumatic or inflatable tire, tube, etc.) of the smart wheel 300 making contact with a road or object as the rotatable component 308 rotates. In certain embodiments, the energy harvester 306 and/or the device platform 302 may be visible from a lateral side of a vehicle or smart wheel 300 (e.g., adjacent a lateral sidewall of the vehicle or smart wheel 300). However, in other embodiments, the energy harvester 306 and/or the device platform 302 may not be visible from the lateral side of the vehicle or smart wheel 300. The energy harvested by the energy harvester 306 may be used to power various components of the device platform 302, such as various sensors and/or communication interfaces within the sensor housing 304, as described in further detail below.

In various embodiments, the energy harvester 306 may be positioned on a side wall of the rotatable component 308. For example, the energy harvester 306 may be positioned between a bead area of the flexible component 310 (e.g., a tire, tube, belt, etc.) and the rotatable component 308 (e.g., a rim, shaft, etc.). Accordingly, the flexible component 310 may be mounted on the rotatable component 308. The energy harvester 306 may generate energy resulting from a compressive force acting on the bead area of the flexible component 310 (e.g., tire, tube, etc.) as the vehicle travels over a surface (e.g., a road).

Figure 3B:
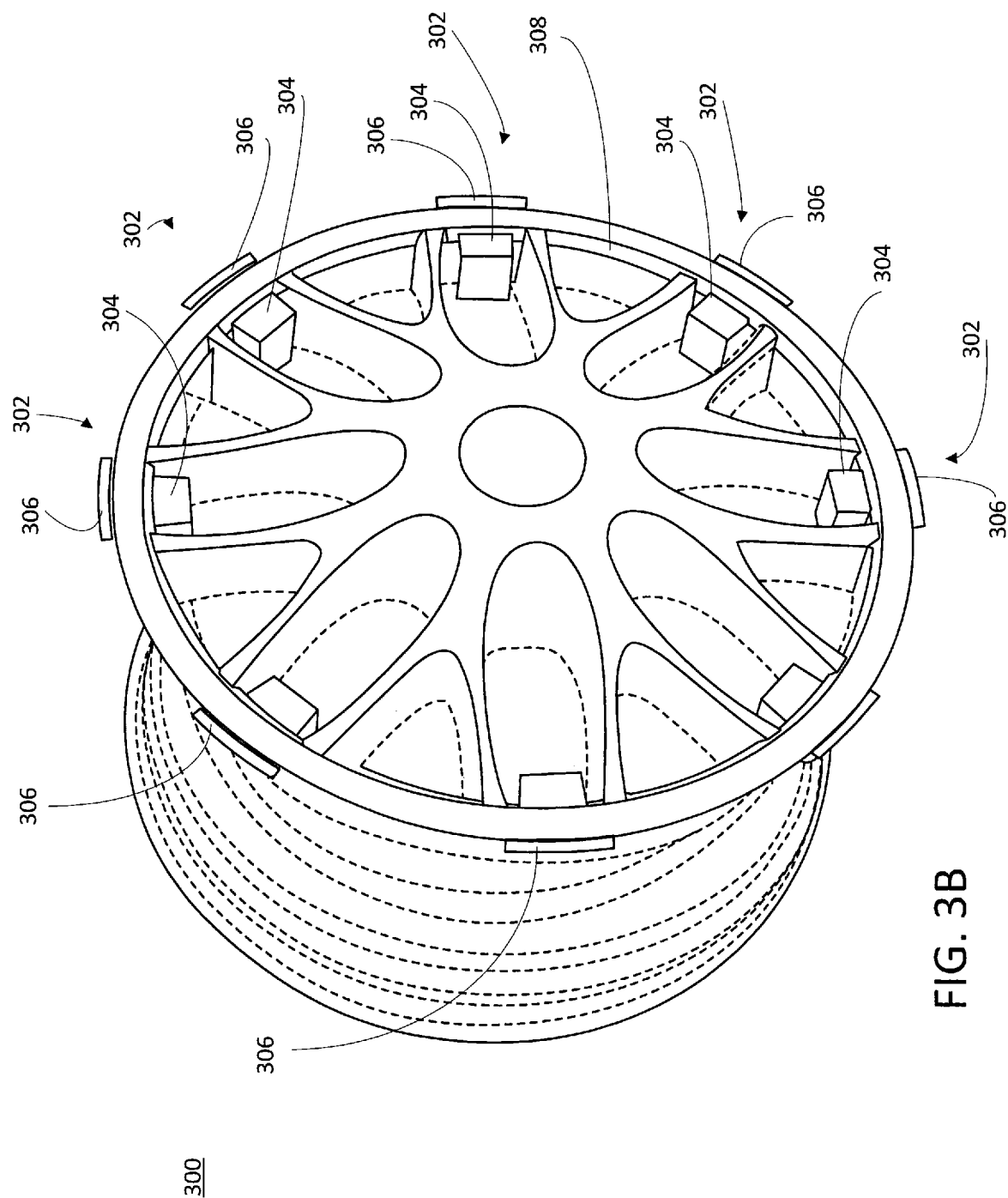
FIG. 3B is a perspective illustration of the smart wheel without the flexible component, in accordance with various embodiments.

FIG. 3B is a perspective illustration of the smart wheel 300 without the flexible component, in accordance with various embodiments. As illustrated, the energy harvester 306 may be positioned around a circumference of the rotatable component 308. Accordingly, the energy harvester 306 may generate energy resulting from a compressive force of a moving object (e.g., a vehicle, acting on the bead area of the tire mounted on the rotatable component 308). In some embodiments, the compressive force may be due to loading (e.g., acceleration, deceleration, etc.). As such, the location of the compressive force may vary depending on the loading. In further embodiments, the energy harvester 306 may capture a kinetic energy of the transport moving in response to the rotatable component 308 rotating. Accordingly, the energy harvester 306 may generate energy when mechanical stress is applied to the energy harvester 306.

Figure 4A:
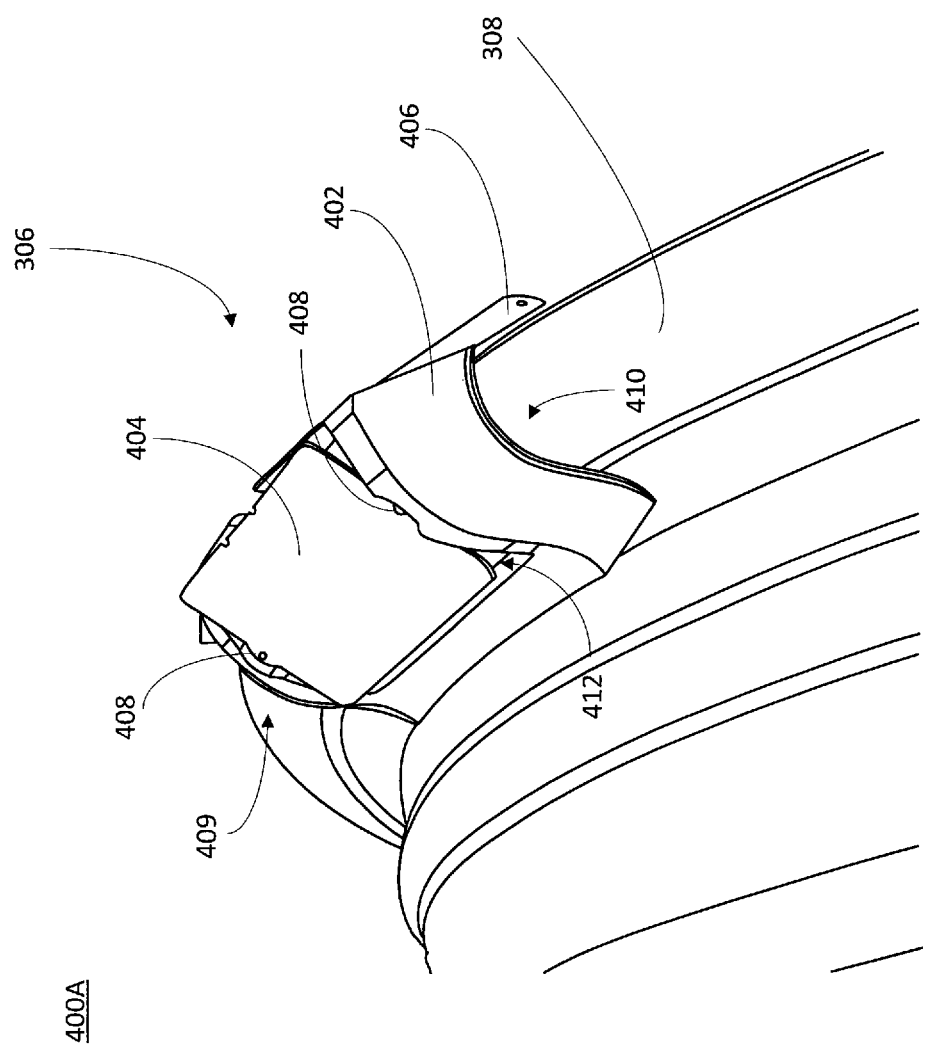
FIG. 4A is a perspective illustration of the energy harvester, in accordance with various embodiments.

FIG. 4A is a perspective illustration 400A of the energy harvester 306, in accordance with various embodiments. The energy harvester 306 may be positioned along a circumference of the rotatable component 308 (e.g., the rim). The energy harvester 306 may include a substrate 402 that is configured to contact and be fixedly coupled to the rotatable component 308. The substrate 402 may support a piezoelectric component 404. The piezoelectric component may be a transducer that converts a mechanical deformation into energy, in accordance with some embodiments.

The energy harvester 306 may include an electrical conduction component 406 configured to channel and offload the energy produced by the piezoelectric component 404. This electrical conduction component may be connected with other devices of the device platform (e.g., sensors of the sensor housing) to provide power to the other devices of the device platform. In certain embodiments, this electrical conduction component 406 may be composed of a flexible conductive material such as brass or copper. The energy harvester 306 may also include location pins 408 based on which the piezoelectric component 404 may be secured to the substrate 402. For example, the piezoelectric component 404 may include a wingtip feature 409 with an open hole through which the location pins 408 are configured to pass through in a secure manner to secure the piezoelectric component to the substrate 402, as described in further detail below.

In various embodiments, the substrate 402 may include a three dimensional curved bottom surface 410 that interfaces with the rotatable component 308 (e.g., rim) of the smart wheel. This three dimensional curved bottom surface 410 may include a compound curve in three dimensions (e.g., length, height, and width). As noted above, each of the length, height, and width may define dimensions or axes orthogonal to each other in three dimensional physical space. For example, the length may be along an axis orthogonal to the height, which may be along an axis orthogonal to the width, which may be along an axis orthogonal to the length. In certain embodiments, the length, height, and width may be referred to as an x-axis, a z-axis, and a y-axis, respectively. Also, the substrate 402 may include a curved staging surface 412 (e.g., a micro cavity or depression) opposite the bottom surface 410. This staging surface 412 (e.g., a top surface) may also be referred to as a top surface of the substrate. In some embodiments, the curved staging surface 412 is curved in only two dimensions (e.g., two of a length, a height and a width, as described in further detail below. When a force is applied onto the piezoelectric component 404, the piezoelectric component 404 will deform and conform against the two-dimensional curved staging surface 412, which limits the amount of deformation of the piezoelectric component 404. Accordingly, the piezoelectric component 404 can sit on the rotatable component 308 via the three dimensional curved bottom surface 410. Also, the rectangular piezoelectric component 404 may be configured to bend within the two-dimensional curved staging surface 412. In certain embodiments, the two-dimensional curved staging surface 412 may be referred to as a convex surface. Accordingly, the two-dimensional curved staging surface 412 may include (e.g., be) a convex surface to which the piezoelectric component 404, with a straight (e.g., non-curved or flat) shape or surface, may be attached. In certain embodiments, the substrate 402 may be referred to as a teardrop support. Accordingly, the piezoelectric component 404 may be bent against the convex two-dimensional curved staging surface 412 to generate compressive bending strain on the piezoelectric component 404. Stated another way, the piezoelectric component 404 may incur strain such that the piezoelectric component 404 is bent to conform against the convex two-dimensional curved staging surface 412 (e.g., bends against the convex surface) to generate electrical charge (e.g., via piezoelectric material layer mechanical deformation). Accordingly, the substrate 402 may be structured to enable a strain (e.g., relative motion/deflection) of the piezoelectric component 404 when placed between the tire and rotatable component 308 of a wheel (e.g., by the tire pushing down against the piezoelectric component 404).

In various embodiments, the piezoelectric component 404 may include a piezoelectric material that is at least one of a crystal and semiconductor material or a polymer and organic material. Examples of a crystal and semiconductor material may include: polyvinylidene fluoride, gallium phosphate, sodium bismuth titanate, lead zirconate titanate, quartz, berlinite (AlPO4), sucrose (table sugar), rochelle salt, topaz, tourmaline-group minerals, lead titanate (PbTiO3), langasite (La3Ga5SiO14), gallium orthophosphate (GaPO4), lithium niobate (LiNbO3), lithium tantalate (LiTaO3), any of a family of ceramics with perovskite, tungsten-bronze, potassium niobate (KNbO3), sodium tungstate (Na2WO3), Ba2NaNb5O5, Pb2KNb5O15, sodium potassium niobate ((K,Na)NbO3) (e.g., NKN, or KNN), bismuth ferrite (BiFeO3), sodium niobate (NaNbO3), barium titanate (BaTiO3), bismuth titanate (Bi4Ti3O12), sodium bismuth titanate (NaBi(TiO3)2), zincblende crystal, GaN, InN, AlN, and ZnO. Examples of a polymer and organic material may include: polyvinylidene fluoride (PVDF) and its copolymers, polyamides, and paralyne-C, polyimide and polyvinylidene chloride (PVDC), and diphenylalanine peptide nanotubes (PNTs).

In various embodiments, the substrate 402 may include at least one material such as: brass, steel, spring steel sheet (SS), carbon fiber, aluminum and its alloys, titanium and its alloys, S2 fiberglass rods, glass fiber reinforced polymer laminate (Fiberite HMS/33), fiberglass, kevlar laminate, carbon fiber reinforced materials, aramid fiber reinforced materials, fiber-reinforced plastic (FRP), copper, and alloys.

Figure 4B:
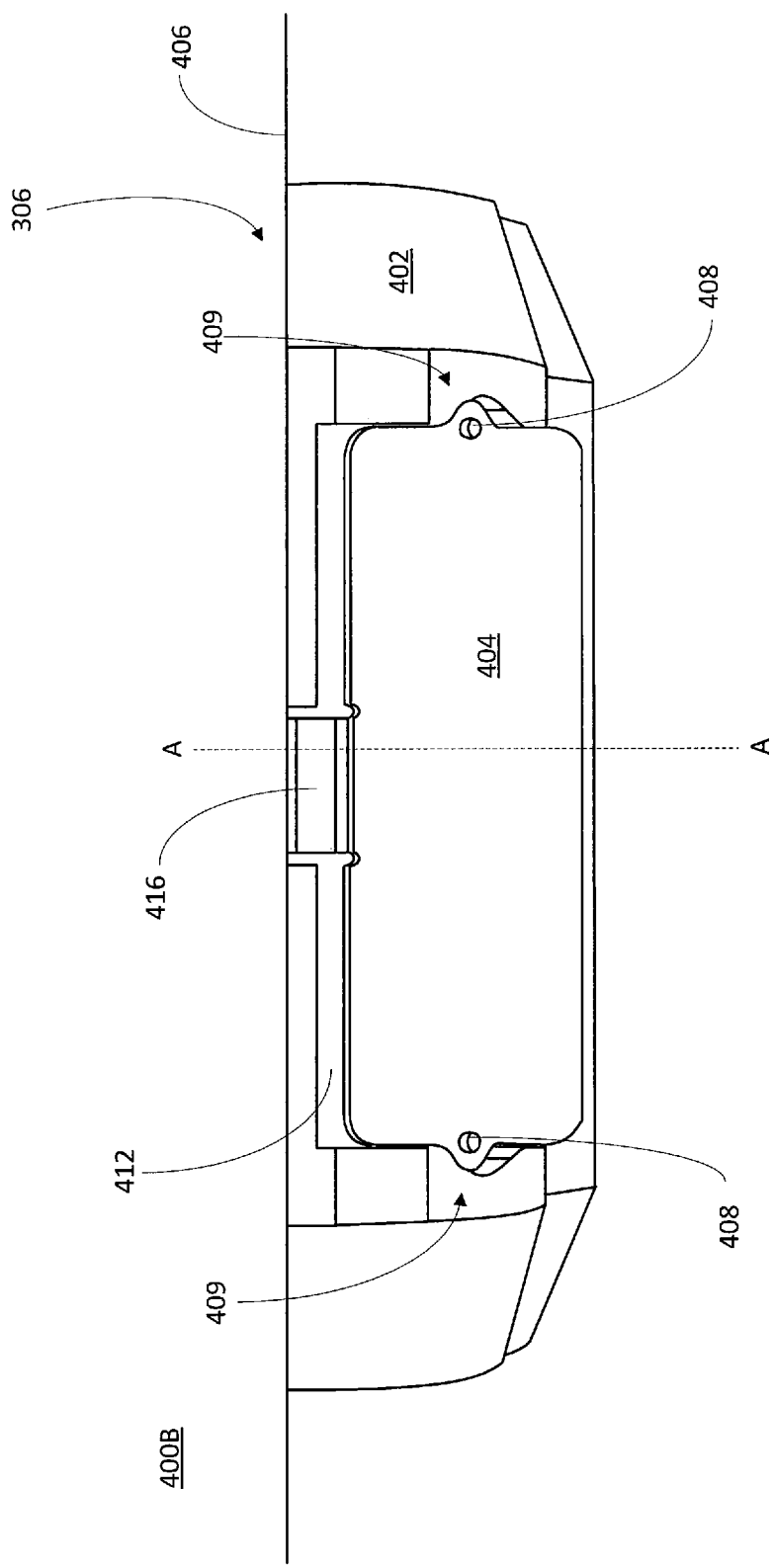
FIG. 4B is a top view illustration of the energy harvester, in accordance with various embodiments.

FIG. 4B is a top view illustration 400B of the energy harvester 306, in accordance with various embodiments. The top view illustration 400B illustrates how the electrical conduction component 406 may be connected with the piezoelectric component 404 via an interconnect 416. Stated another way, the interconnect 416 may be a flexible structure that connects the piezoelectric component 404 to the electrical conduction component 406 so that the electrical conduction component 406 may channel and offload the energy produced by the piezoelectric component 404. This electrical conduction component may be connected with other devices of the device platform to provide power to the other devices of the device platform.

Also, the top view illustration 400B illustrates how the substrate 402 may also include location pins 408 which secure the piezoelectric component 404 to the substrate 402. For example, the piezoelectric component 404 may include a wingtip feature 409 with an open hole through which the location pins 408 are configured to pass to secure the piezoelectric component to the substrate 402. Also illustrated is the two-dimensional curved staging surface 412 within a cavity formed by the substrate 402. FIG. 4B further illustrates a cross sectional line A-A which will be referenced further below in connection with FIG. 5A and FIG. 5B.

Figure 4C:
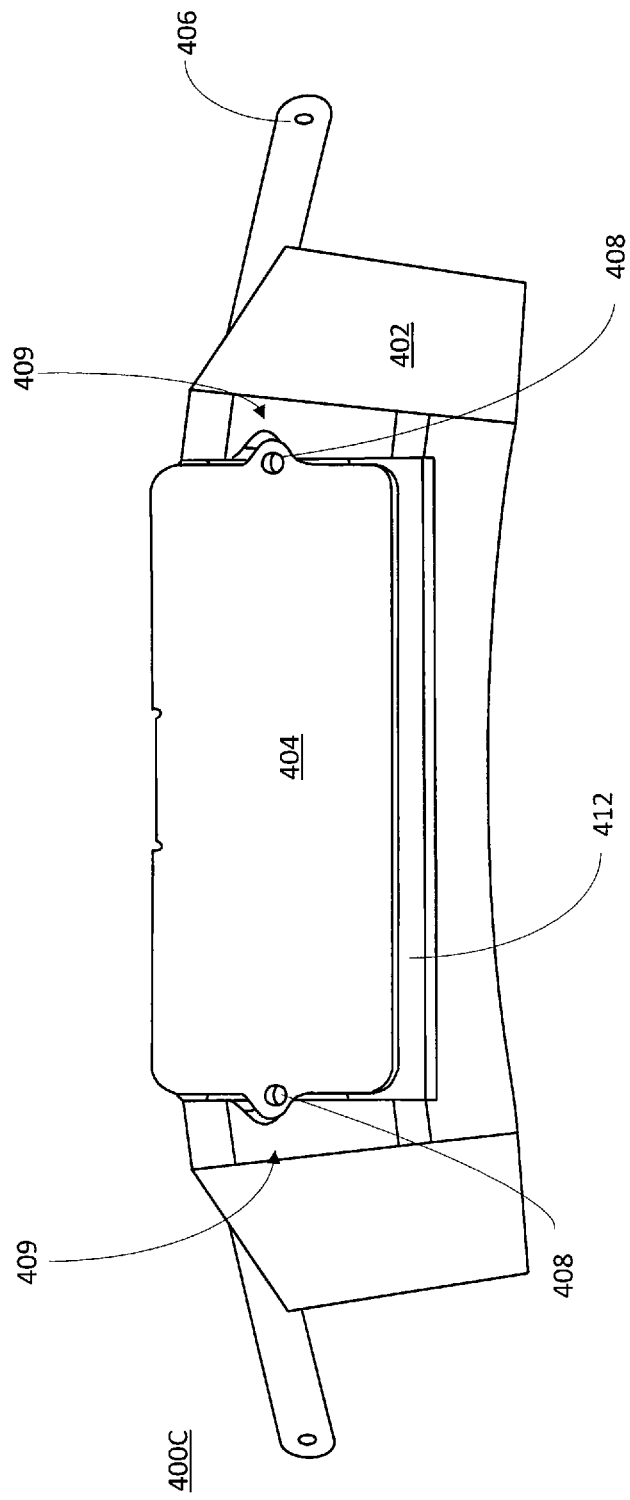
FIG. 4C is a front view illustration of the energy harvester, in accordance with various embodiments.

FIG. 4C is a front view illustration 400C of the energy harvester 306, in accordance with various embodiments. The front view illustration 400C illustrates how the electrical conduction component 406 may be generally behind the substrate 402. Also, the front view illustration 400C illustrates another view of how the substrate 402 may also include location pins 408 for securing the piezoelectric component 404 to the substrate 402. For example, the piezoelectric component 404 may include the wingtip feature 409 with an open hole through which the location pins 408 are configured to pass to secure the piezoelectric component to the substrate 402. Also illustrated is the two-dimensional curved staging surface 412 within a cavity formed by the substrate 402.

Figure 4D:
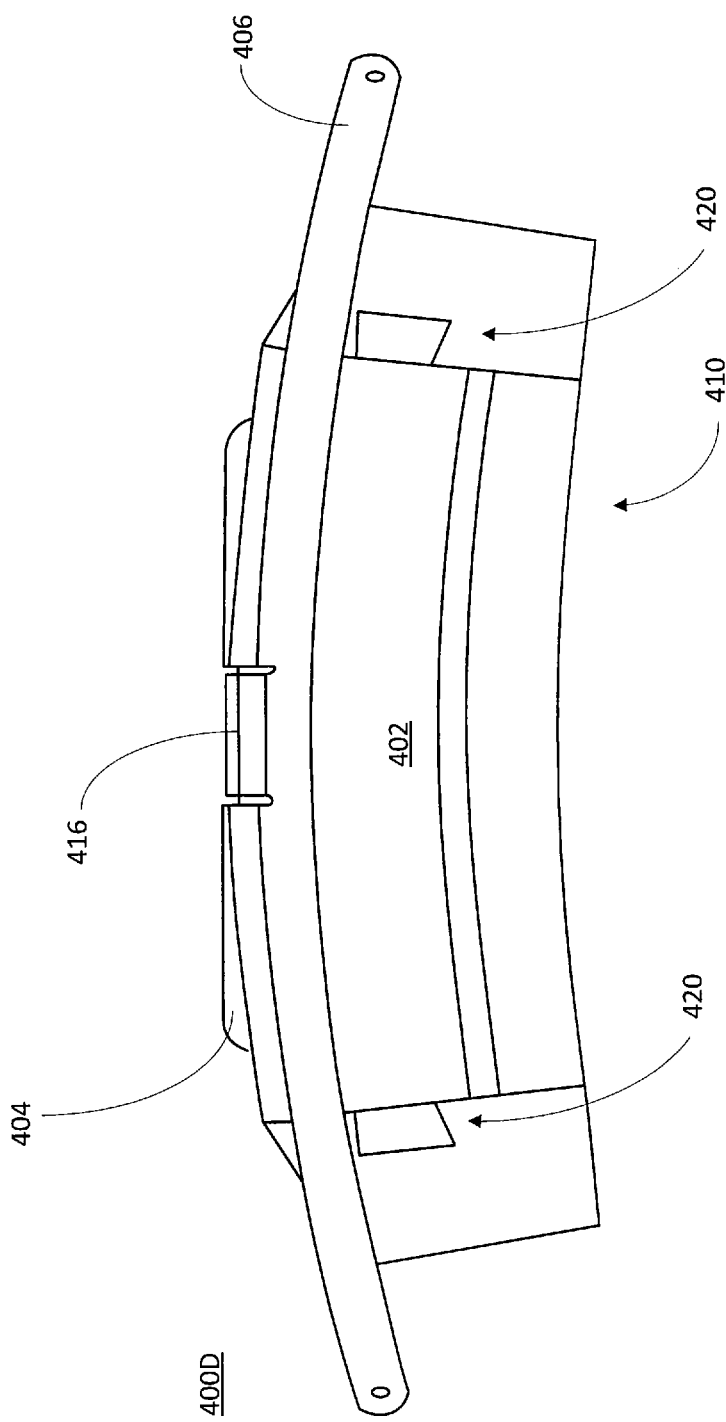
FIG. 4D is a back view illustration of the energy harvester, in accordance with various embodiments.

FIG. 4D is a back view illustration 400D of the energy harvester 306, in accordance with various embodiments. The back view illustration 400D illustrates how the electrical conduction component 406 may be generally behind the substrate 402 (e.g., in the foreground in the back view illustration 400D). The back view illustration 400D also includes the three-dimensional curved bottom surface 410 and physical interconnection features 420 on the substrate 402. This physical interconnection features 420 may be utilized to physically connect different substrates 402 together, as will be discussed in further detail below. The illustrated physical interconnection features 420 may be convex physical interconnection features 420 configured to interconnect with concave physical interconnection features (not illustrated in FIG. 4D).

FIG. 4E is a bottom view illustration 400E of the energy harvester 306, in accordance with various embodiments. The bottom view illustration 400E illustrates how the electrical conduction component 406 may be generally behind the substrate 402. The bottom view illustration 400E also includes the three-dimensional curved bottom surface 410 and physical interconnection features 420 on the substrate 402. As noted above, this physical interconnection features 420 may be utilized to physically connect different substrates 402 together, as will be discussed in further detail below. The illustrated physical interconnection features 420 may be convex physical interconnection features 420 configured to interconnect with concave physical interconnection features (not illustrated in FIG. 4E).

Figure 4F:
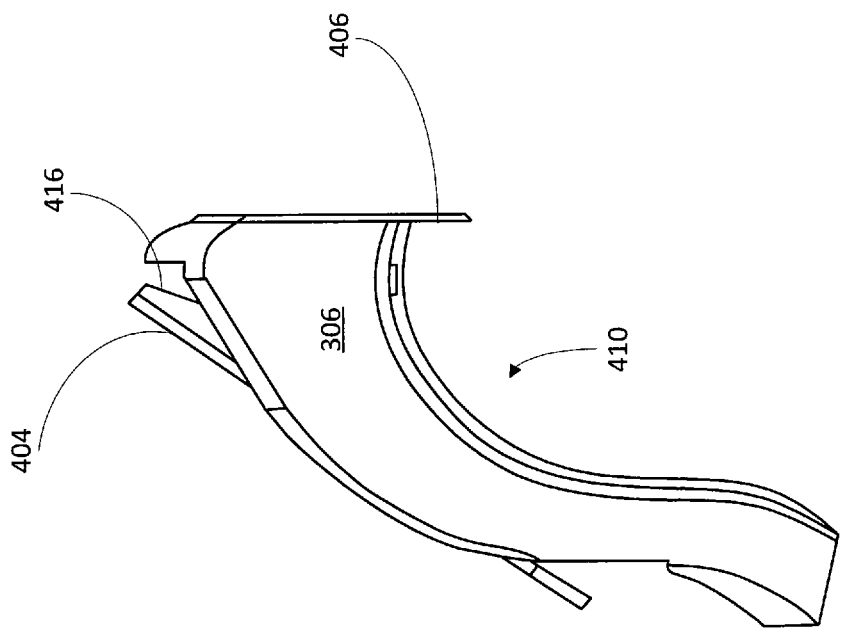
FIG. 4F is a right side view illustration of the energy harvester, in accordance with various embodiments.
Figure 4G:
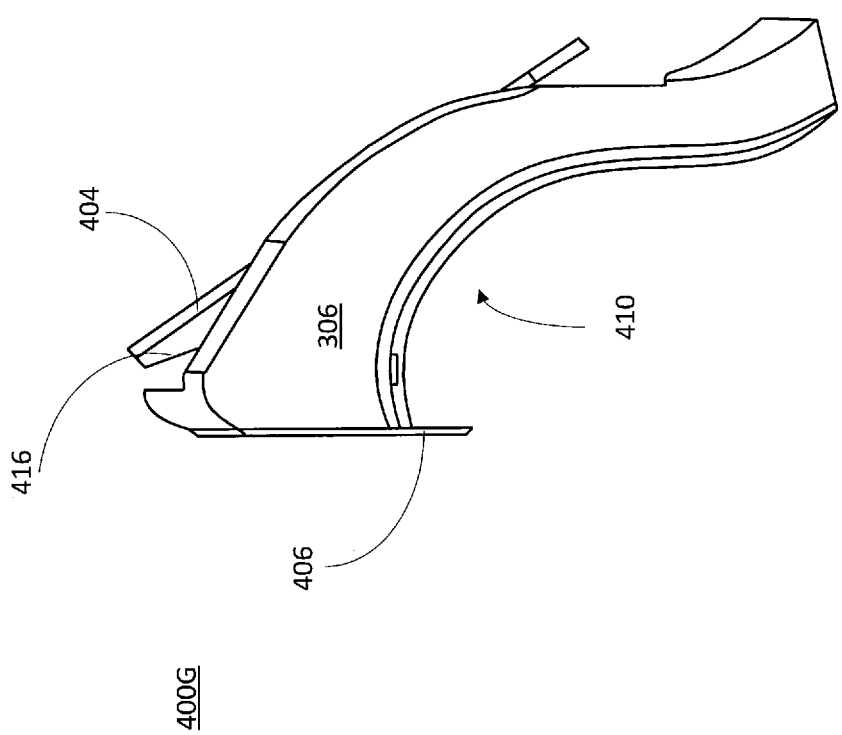
FIG. 4G is a left side view illustration of the energy harvester, in accordance with various embodiments.

FIG. 4F is a right side view illustration 400F of the energy harvester 306, in accordance with various embodiments. Also, FIG. 4G illustrates a left side view illustration 400G of the energy harvester 306, in accordance with various embodiments. A combination of both FIG. 4F and FIG. 4G may be referred to as the side view figures. The side view figures illustrate the electrical conduction component 406 that may be connected with the piezoelectric component 404 via the interconnect 416. Stated another way, the interconnect 416 may be a flexible structure that connects the piezoelectric component 404 to the electrical conduction component 406 so that the electrical conduction component 406 may channel and offload the energy produced by the piezoelectric component 404. This electrical conduction component may be connected with other devices of the device platform to provide power to the other devices of the device platform. The side view figures also illustrate the three dimensional curved bottom surface 410

Figure 5A:
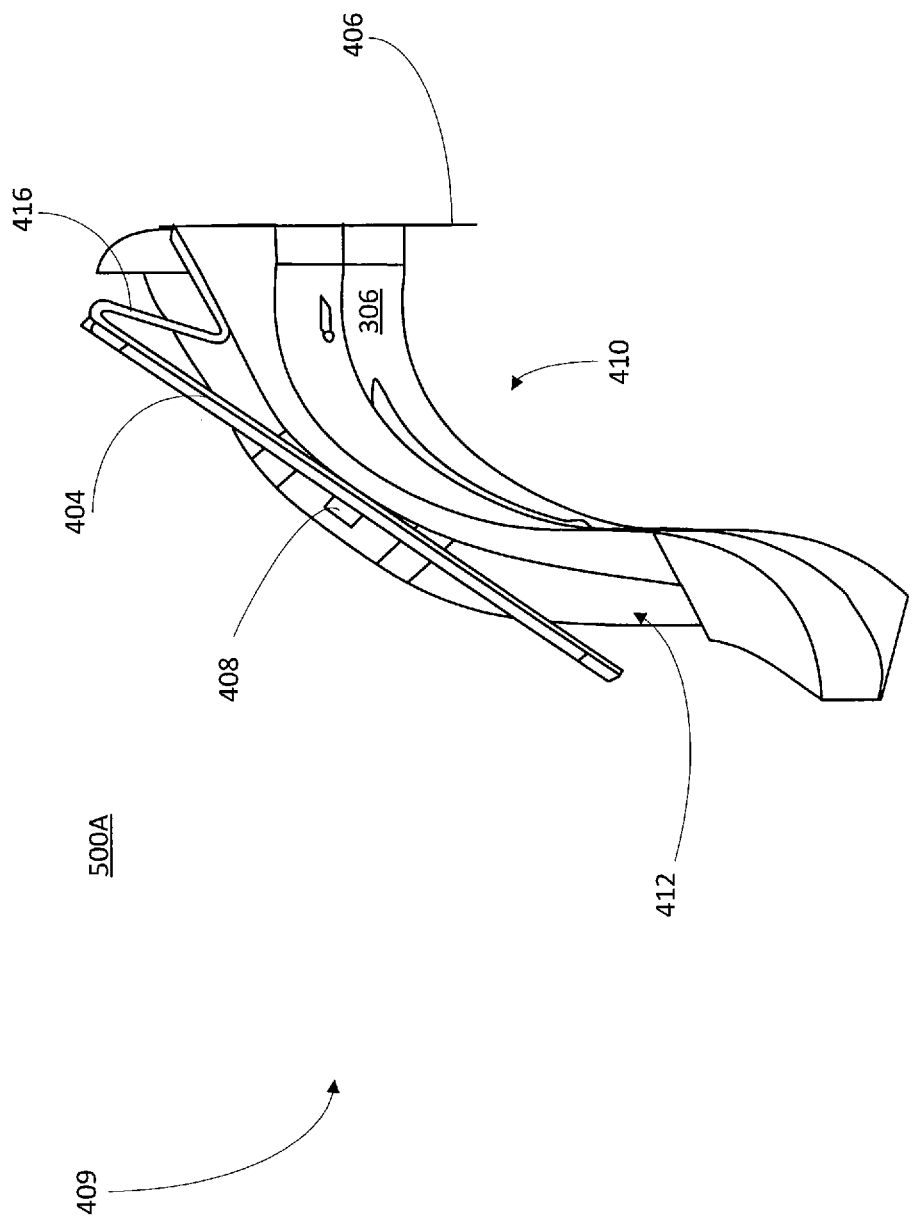
FIG. 5A is a side cross sectional view of the energy harvester with the piezoelectric component in an unbiased state, in accordance with various embodiments.

FIG. 5A is a side cross sectional view 500A of the energy harvester 306 with the piezoelectric component 404 in an unbiased state, in accordance with various embodiments.

The side cross sectional view 500A may be across the cross section A-A illustrated above in FIG. 4B. Returning to FIG. 5A, the side cross sectional view 500A illustrates how the electrical conduction component 406 may be connected with the piezoelectric component 404 via the interconnect 416. Thus, the interconnect 416 may be a flexible structure that connects the piezoelectric component 404 to the electrical conduction component 406 so that the electrical conduction component 406 may channel and offload the energy produced by the piezoelectric component 404. This electrical conduction component may be connected with other devices of the device platform to provide power to the other devices of the device platform.

Also, the side cross sectional view 500A illustrates how the substrate 402 may also include location pins 408 based on which the piezoelectric component 404 may be secured to the substrate 402. Also illustrated is the two-dimensional curved staging surface 412 within a cavity formed by the substrate 402. The three-dimensional curved bottom surface 410 is illustrated below and opposite the two-dimensional curved staging surface 412. As shown in FIG. 5A, the two-dimensional curved staging surface 412 is curved in two dimensions (e.g., the width and height dimensions but not the length dimension) to form a 2-D convex surface. In contrast, the three-dimensional bottom surface 410 is curved in each of the width, height and length dimensions. In some embodiments, the 3-D bottom surface 410 has an S-shape cross-section, as shown in FIG. 5A. The piezoelectric component 404 in an unbiased state may be flat (e.g., unbent) in the unbiased state as it may not experience sufficient strain to be biased.

Figure 5B:
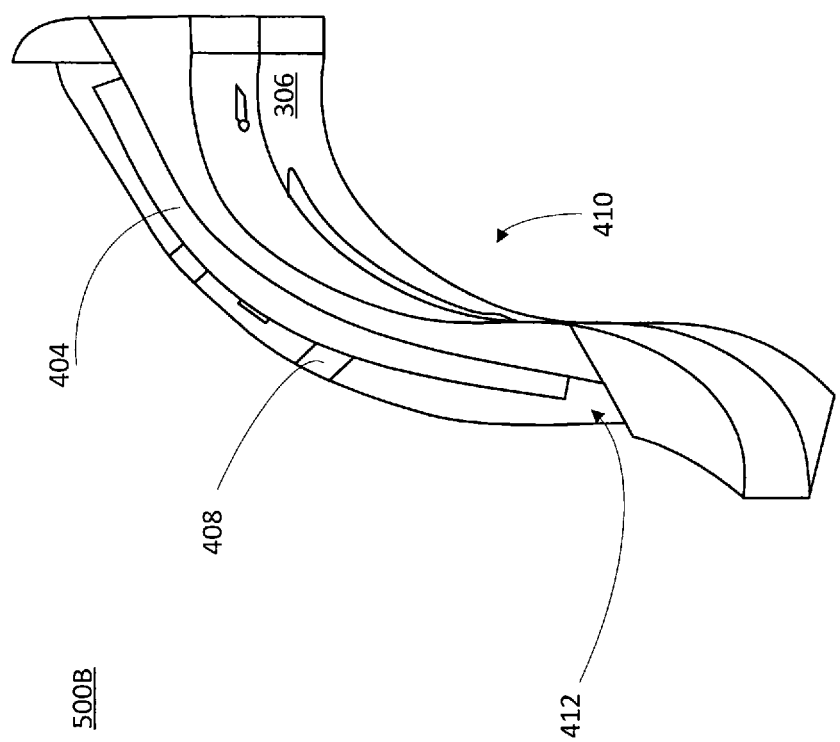
FIG. 5B is a side cross sectional view of the energy harvester with the piezoelectric component 404 in a biased state, in accordance with various embodiments.

FIG. 5B is a side cross sectional view 500B of the energy harvester 306 with the piezoelectric component 404 in a biased state, in accordance with various embodiments. The side cross sectional view 500B may be across the cross section A-A illustrated above in FIG. 4B. Returning to FIG. 5B, the piezoelectric component 404 in a biased state may experience a sufficient amount of strain to bend the piezoelectric component such that it conforms to the two-dimensional curved staging surface 412. As noted above, the piezoelectric component 404 may alternate between the biased and unbiased states as a rotatable component turns. Thus, the load from a wheel or vehicle may displace the piezoelectric component and generate a charge (e.g., electrical energy). In some embodiments, the energy harvester can generate continuous power as the rotatable component rotates. In certain embodiments, this energy may be in the form of an alternating current (AC) signal, which can be rectified into a direct current (DC) signal. Stated another way, the bending strain experienced at the piezoelectric component may generate energy (e.g., an alternating current (AC) voltage) with a frequency proportional to the rotational frequency of the wheel. In some embodiments, the AC signal is rectified by a rectification circuit contained within the sensor 304.

Figure 6:
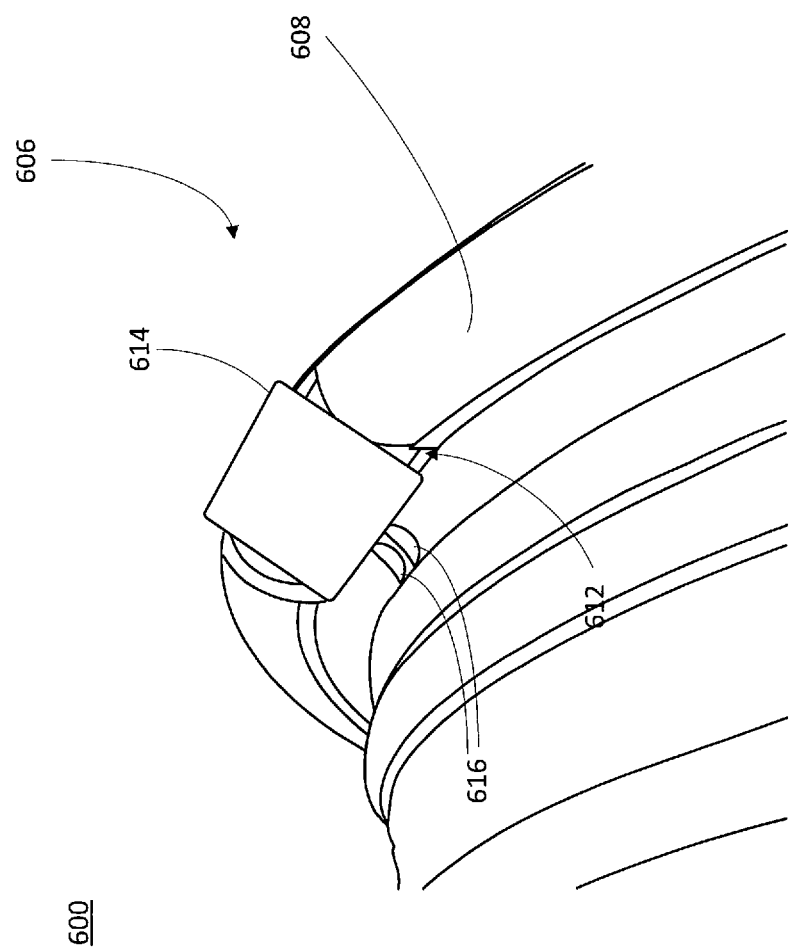
FIG. 6 is a perspective illustration of an integrated energy harvester, in accordance with various embodiments.

FIG. 6 is a perspective illustration 600 of an integrated energy harvester 606, in accordance with various embodiments. The integrated energy harvester 606 may be positioned along a circumference of the rotatable component 608 (e.g., the rim) without need for a substrate. Stated another way, the integrated energy harvester 606 may be integrated within the rotatable component 608 and thus without a separate physical substrate structure. The rotatable component 608 may include a curved staging surface 612 formed on the rotatable component 608 (e.g., a micro cavity or depression formed on the rotatable component 608). In some embodiments, the curved staging surface 12 is curved in only two dimensions (e.g., the height and width directions but not the length direction) so as to form a two-dimensional convex surface 612. The piezoelectric component 614 may incur strain to deform and conform to the two-dimensional curved staging surface 612. Also, this two-dimensional curved staging surface 612 may be different than the rest of the rotatable component 608 which may have a three dimensional curved surface. The rectangular piezoelectric component 614 may be configured to bend within the two-dimensional curved staging surface 612. In certain embodiments, the two-dimensional curved staging surface 612 may be referred to as a convex surface. Accordingly, the two-dimensional curved staging surface 612 may include (e.g., be) a convex surface to which the piezoelectric component 614, with a straight (e.g., non-curved or flat) shape or surface, may be more easily and securely attached compared to a 3-D curved surface. The piezoelectric component 614 may be bent against the convex two-dimensional curved staging surface 612 to generate compressive bending strain on the piezoelectric component 614. Stated another way, the piezoelectric component 614 may incur strain such that the piezoelectric component is bent to conform against the convex two dimensional curved staging surface 612 (e.g., bends against the convex surface) to generate electrical charge (e.g., via piezoelectric material layer mechanical deformation). Thus, the convex two-dimensional curved staging surface 612 of the rotatable component 608 may be structured to enable a strain (e.g., relative motion/deflection) of the piezoelectric component 614 when placed between the tire and rotatable component 608 of a wheel (e.g., by the tire pushing down against the piezoelectric component 614).

The integrated energy harvester 606 may include an electrical conduction component 616 configured to channel and offload the energy produced by the piezoelectric component 614. This electrical conduction component may be connected to leads of a rechargeable battery contained within a sensor housing 304 (FIGS. 3A and 3B) of the device platform to provide power to the sensor(s) within the sensor housing 304. In certain embodiments, this electrical conduction component 616 may be composed of a flexible conductive material such as brass or copper. The integrated energy harvester 606 may also include location pins (not illustrated) to secure the piezoelectric component 614 to the convex two-dimensional curved staging surface 612 of the rotatable component 608.

In certain embodiments, the piezoelectric component may be formed with different types of layers. For example, one type of layer of the piezoelectric component may be a tensile load-backing layer. This tensile load-backing layer may be, for example, a steel plate with sufficient tensile load flexibility to keep the piezoelectric component together. Another type of layer of the piezoelectric component may be a piezoelectric material layer that may be configured to generate electrical charge via mechanical deformation. Yet another type of layer of the piezoelectric component may be an electrode layer to harvest electrical energy (e.g., electrical charge) from the piezoelectric material layer.

Figure 7A:
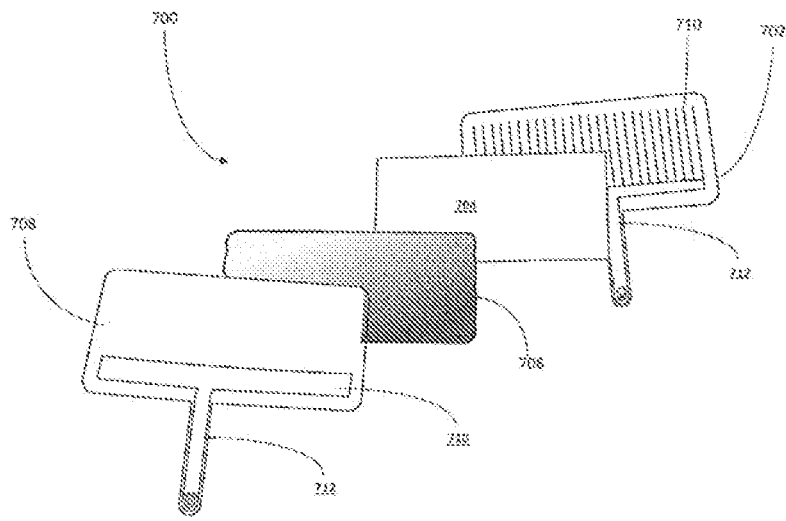
FIG. 7A illustrates different layers of a piezoelectric component, in accordance with various embodiments.

FIG. 7A illustrates different layers of a piezoelectric component 700, in accordance with various embodiments. A first layer of the piezoelectric component 700 may be a first electrode layer 702. A second layer of the piezoelectric component 700 may be a piezoelectric material layer 704. A third layer of the piezoelectric component 700 may be a tensile load-backing layer 706. The fourth layer of the piezoelectric component may be a second electrode layer 708.

In certain embodiments, the first electrode layer 702 may be assembled with (e.g., be in direct physical contact when assembled with) the piezoelectric material layer 704. The piezoelectric material layer 704 may be assembled with (e.g., be in direct physical contact when assembled with) the tensile load-backing layer 706. The tensile load-backing layer 706 may be assembled with (e.g., be in direct physical contact when assembled with) the second electrode layer 708.

In certain embodiments, this first electrode layer 702 may be closest to a two dimensional curved staging surface 412. For example, when the two dimensional curved staging surface 412/612 is on a substrate or directly on a rotatable component, the first electrode layer 702 may directly contact the a two dimensional curved staging surface of the substrate or the rotatable component when the piezoelectric component (that includes the first electrode layer 702) is biased. Also, the second electrode layer 708 may be (among the different layers) the furthest from the two dimensional curved staging surface.

Each electrode layer (e.g., the first electrode layer 702 and the second electrode layer 708) may include an electrode 710 embedded within (e.g., held in place by) a flexible material (e.g., an epoxy). In certain embodiments, such as illustrated with the first electrode layer 702, the electrode 710 may be formed as a mesh that may directly contact the piezoelectric material layer to harvest electrical charge from the piezoelectric material layer 704. In other embodiments, such as illustrated with the second electrode layer 708, the electrode 710 may be formed as a mesh that may indirectly contact (e.g., via the tensile load backing layer 706) the piezoelectric material layer to harvest electrical charge from the piezoelectric material layer 704. Accordingly, the first electrode layer 702 and the second electrode layer 708 may represent different circuits with different electric potentials, such that there is an electric potential difference between the first electrode layer 702 and the second electrode layer 708.

Each electrode layer may interface with a flexible interconnect 712 connected with their respective electrode 710. This flexible interconnect 712 may be configured for interconnection of the electrode 710 in the electrode layer 702 to other electrical components, such as to provide power to devices of a smart wheel sensor system or for the devices of the smart wheel sensor system to perform measurements off of the flexible interconnect (e.g., measurements of energy or electric potential).

In particular embodiments, the tensile load backing layer 706 may be made of stainless steel. The tensile load backing layer may provide additional physical support to hold the piezoelectric component in a flat state when unbiased. For example, the tensile load backing layer may be flat or unbent in a resting or unbiased position such that after tension is released from the piezoelectric component, the tensile load backing layer may unbias or physically reorient the piezoelectric component into an unbiased state (e.g., a flat state).

In various embodiments, the piezoelectric material layer 704 may be made of a piezoelectric material. This piezoelectric material may be, for example, at least one of a crystal and semiconductor material or a polymer and organic material. Examples of a crystal and semiconductor material may include: polyvinylidene fluoride, gallium phosphate, sodium bismuth titanate, lead zirconate titanate, quartz, berlinite ($AlPO_4$), sucrose (table sugar), rochelle salt, topaz, tourmaline-group minerals, lead titanate ($PbTiO_3$), langasite ($La_3Ga_5SiO_{14}$), gallium orthophosphate ($GaPO_4$), lithium niobate ($LiNbO_3$), lithium tantalate ($LiTaO_3$), any of a family of ceramics with perovskite, tungsten-bronze, potassium niobate (KNbO3), sodium tungstate (Na2WO3), Ba2NaNb5O5, Pb2KNb5O15, sodium potassium niobate ((K,Na)NbO3) (e.g., NKN, or KNN), bismuth ferrite (BiFeO3), sodium niobate (NaNbO3), barium titanate (BaTiO3), bismuth titanate (Bi4Ti3O12), sodium bismuth titanate (NaBi(TiO3)2), zincblende crystal, GaN, InN, AlN, and ZnO. Examples of a polymer and organic material may include: polyvinylidene fluoride (PVDF) and its copolymers, polyamides, and paralyne-C, polyimide and polyvinylidene chloride (PVDC), and diphenylalanine peptide nanotubes (PNTs).

In various embodiments, the electrode layers may be electrically bonded to other layers of the piezoelectric component (e.g., to the tensile load backing layer and/or the piezoelectric material layer). Also, the tensile load backing layer may be electrically and/or mechanically bonded to the piezoelectric material layer. The assembly of all the layers of a piezoelectric component may form the piezoelectric component (which may be referred to as a piezoelectric electrode assembly in certain embodiments). In further embodiments, the piezoelectric component may be encapsulated in a protective coating, such as a heat shrinkable film or a polymer to protect the piezoelectric component from environmental degradation.

Figure 7B:
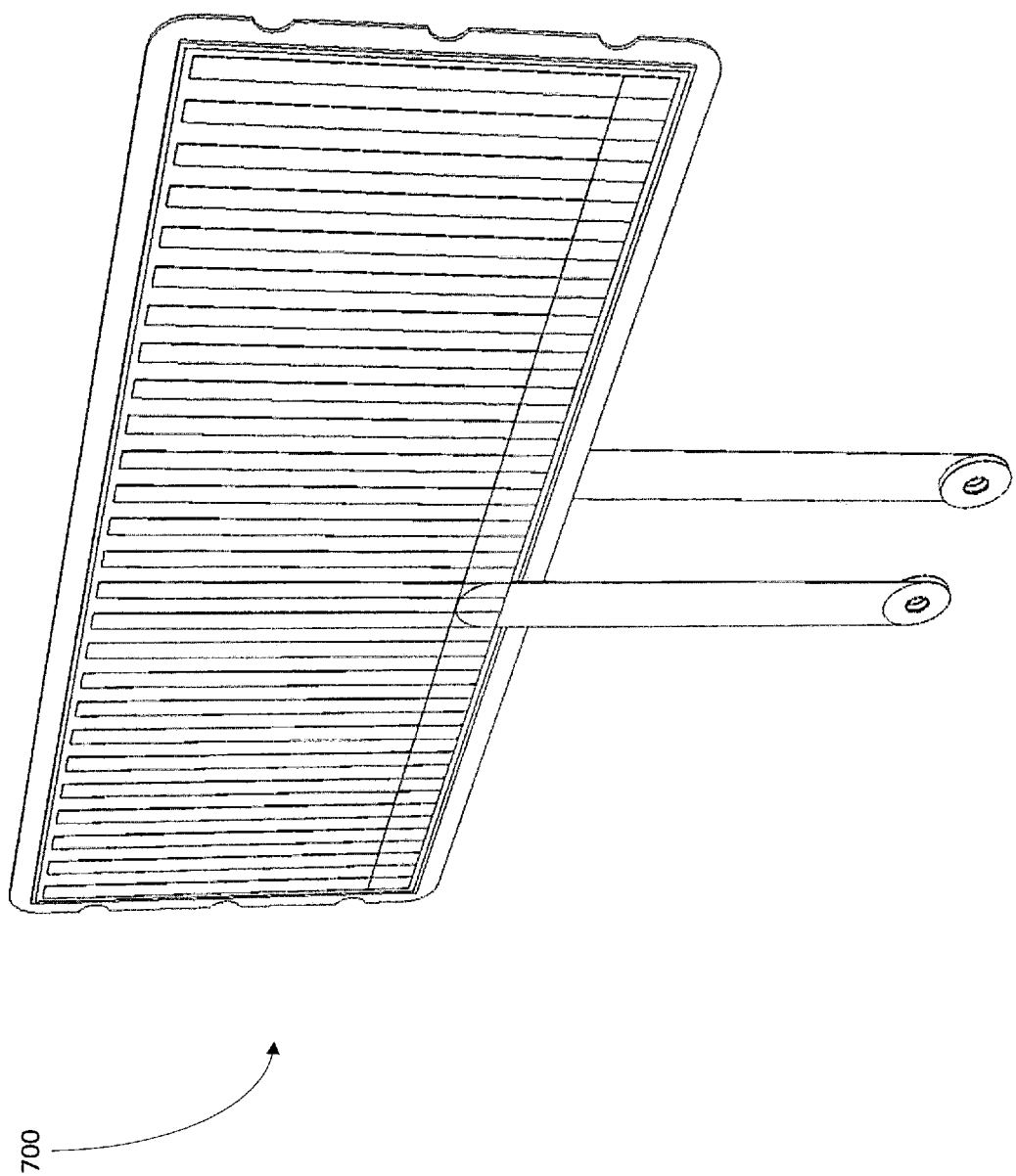
FIG. 7B illustrates the piezoelectric component in an assembled form, in accordance with various embodiments.

FIG. 7B illustrates the piezoelectric component 700 in an assembled form, in accordance with various embodiments. When in an assembled form, the first electrode layer may be in direct physical contact with the piezoelectric material layer. The piezoelectric material layer may be in direct physical contact with the tensile load-backing layer. Lastly, the tensile load backing layer may be in direct physical contact with the second electrode layer.

Figure 8A:
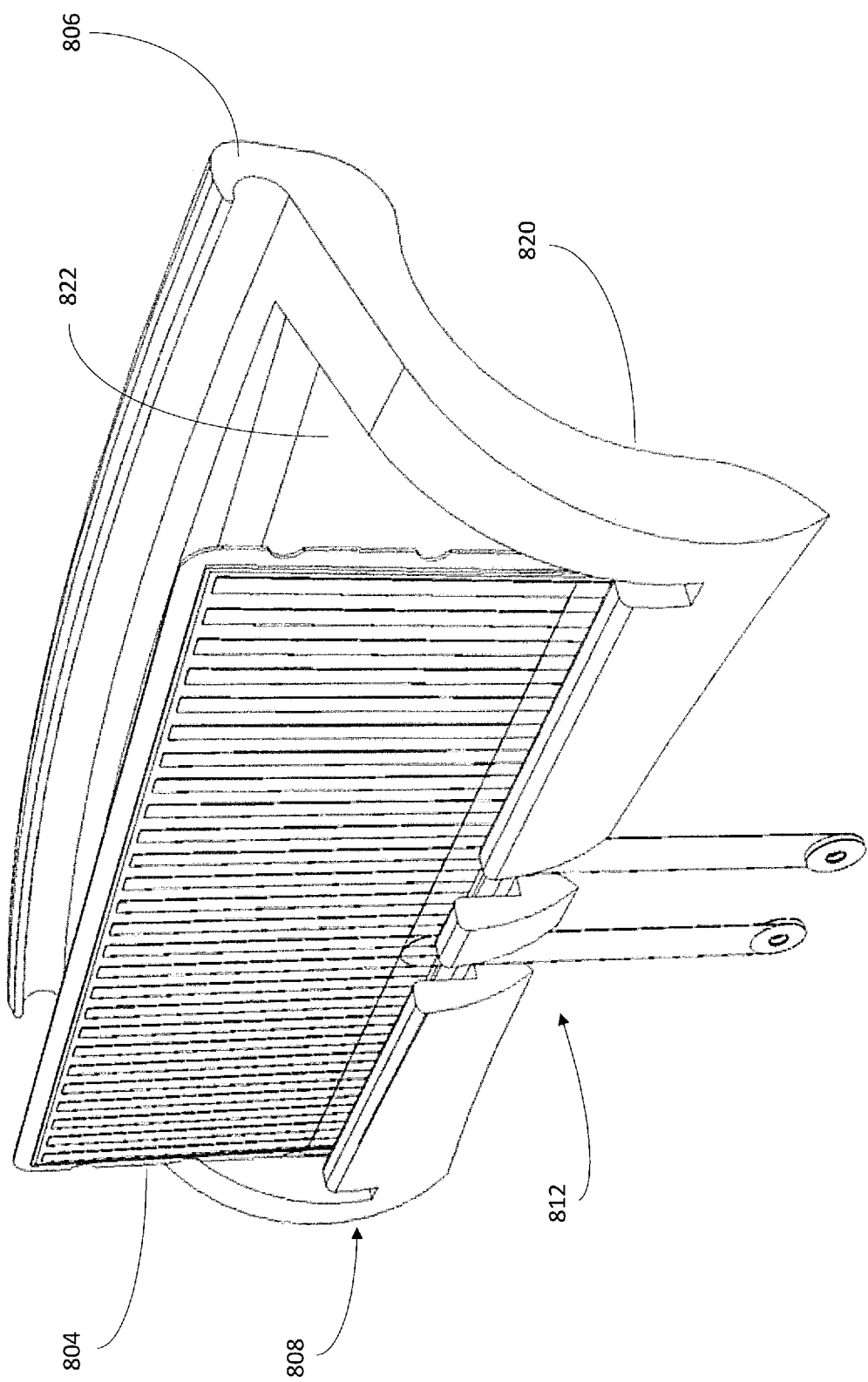
FIG. 8A is a perspective illustration of the energy harvester with a piezoelectric component secured at one end to a substrate, in accordance with various embodiments.

FIG. 8A is a perspective illustration of the energy harvester 802 with a piezoelectric component 804 secured at one end to a substrate 806, in accordance with various embodiments. The piezoelectric component 804 is illustrated with a visible mesh formation. As noted above, the energy harvester 802 may be positioned along a circumference of a rotatable component (e.g., the rim of a wheel). The energy harvester 802 may include the substrate 806 that contacts the rotatable component. The substrate 806 may support the piezoelectric component 804 by securing the piezoelectric component 804 to the substrate 806 at a first end 808 of the piezoelectric component 804. Stated another way, the substrate 806 may clamp down and secure a piezoelectric component 804 at a first end 808 of the piezoelectric component 804.

The energy harvester 802 may include electrical conduction component openings 812 configured to receive an electrical conduction component (not illustrated), such as pins, configured to channel and offload the energy produced by the piezoelectric component 804. This electrical conduction component may be connected with other devices of the device platform to provide power to the other devices of the device platform. In certain embodiments, this electrical conduction component may be composed of a conductive material such as brass or copper.

In various embodiments, the substrate 806 may include a three-dimensional curved bottom surface 820 that interfaces with the rotatable component (e.g., rim) of a wheel. This three-dimensional curved bottom surface 820 may include a compound curve in three dimensions (e.g., length, height, and width) so that the substrate 806 may rest flush with a three dimensional curved surface of the rotatable component. As noted above, each of the length, height, and width may define dimensions or axes orthogonal to each other in three-dimensional physical space. For example, the length may be along an axis orthogonal to the height, which may be along an axis orthogonal to the width, which may be along an axis orthogonal to the length. In certain embodiments, the length, height, and width may be referred to as an x-axis, a z-axis, and a y-axis. Also, the substrate 806 may include a curved staging surface 822 (e.g., a micro cavity or depression in the substrate 806) opposite the bottom surface 820. In some embodiments, the curved staging surface 822 is curved in only two dimensions (e.g., the height and width dimensions). The piezoelectric component 804 may incur strain to deform and conform to the two-dimensional curved staging surface 822. As discussed above, the piezoelectric component 804 can sit on the rotatable component via the three-dimensional curved bottom surface 820 of the substrate 806. Also, the rectangular piezoelectric component 804 may be configured to bend and conform to the two-dimensional curved staging surface 822. In certain embodiments, the two-dimensional curved staging surface 822 may be referred to as a convex surface. Accordingly, the two-dimensional curved staging surface 822 may include (e.g., be) a convex surface to which the piezoelectric component 804, with a straight (e.g., non-curved or flat) shape or surface, may be attached. In certain embodiments, the substrate 806 may be referred to as a teardrop support. Accordingly, the piezoelectric component 804 may be bent against the convex two-dimensional curved staging surface 822 to generate compressive bending strain on the piezoelectric component 804. Stated another way, the piezoelectric component 804 may incur strain such that the piezoelectric component bends due to external forces to conform to the convex two-dimensional curved staging surface 822 to generate electrical charge (e.g., via piezoelectric material layer mechanical deformation). Accordingly, the substrate 806 may be structured to enable a strain (e.g., relative motion/deflection) of the piezoelectric component 804 when placed between the tire and rotatable component of a wheel (e.g., by the tire pushing down against the piezoelectric component 804).

Figure 8B:
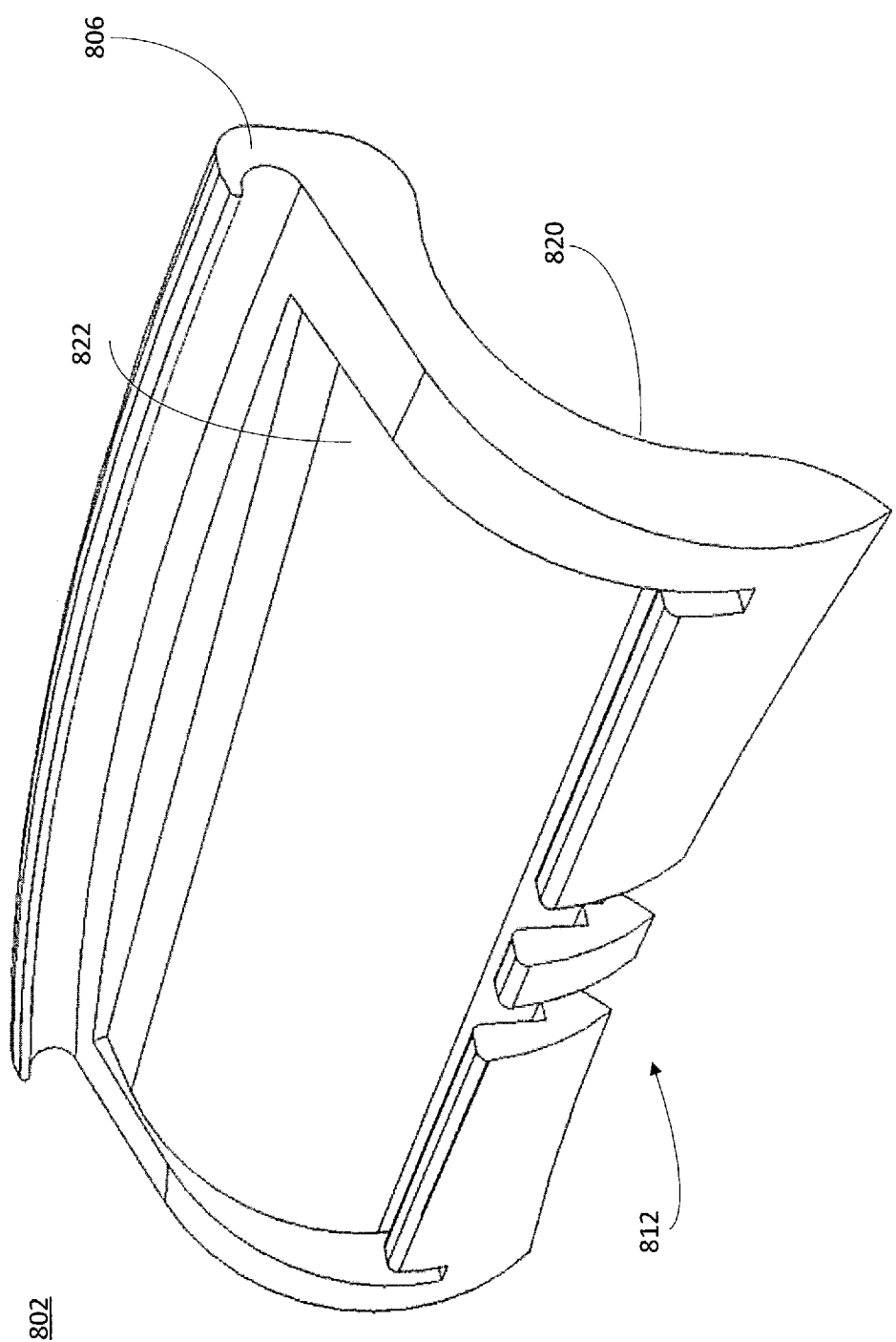
FIG. 8B is a perspective illustration of the substrate without the piezoelectric component, in accordance with various embodiments.

FIG. 8B is a perspective illustration of the substrate 806 without the piezoelectric component, in accordance with various embodiments. As noted above, the substrate may include electrical conduction component openings or slots 812 configured to receive an electrical conduction component (not illustrated), such as pins, configured to channel and offload the energy produced by the piezoelectric component 804. Also, in various embodiments, the substrate 806 may include a three-dimensional curved bottom surface 820 that interfaces with the rotatable component (e.g., rim) of a smart wheel, as described above.

Figures 9A, 9B, 9C, 9D:
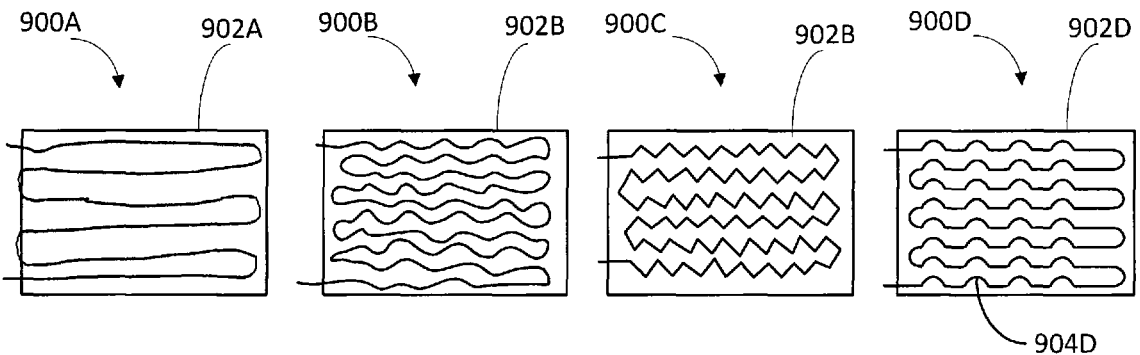
FIG. 9A illustrates an exemplary mesh formation of an electrode as a straight winding, in accordance with various embodiments.
FIG. 9B illustrates an exemplary mesh formation of an electrode as a curved winding, in accordance with various embodiments.
FIG. 9C illustrates an exemplary mesh formation of an electrode as a zig-zag winding, in accordance with various embodiments.
FIG. 9D illustrates an exemplary mesh formation of an electrode as a one sided bowled winding, in accordance with various embodiments.

As introduced above, a piezoelectric component may include a lower electrode layer that may be formed as a mesh to harvest electrical charge from a piezoelectric material layer. The mesh formation (e.g., the physical structure of the mesh) of an electrode layer may be in any configuration or structure. In particular embodiments, the mesh formation of the electrode layer may be as a single elongated electrode that traverses a two dimensional space (e.g., along a surface of a layer of the piezoelectric component). Accordingly, the electrode layer may be a layer of the piezoelectric component that includes an electrode generally held in place by a flexible material (e.g., an epoxy). In particular embodiments, an electrode layer (e.g., an upper electrode layer and/or lower electrode layer) may be monolithic (e.g., be a solid layer of electrode coextensive with a surface of another layer of the piezoelectric component). In further embodiments, the lower electrode layer may include a different mesh formation than the upper electrode layer. In yet further embodiments, the lower electrode layer may include a same mesh formation as the upper electrode layer. FIGS. 9A-9Q illustrate a number of different exemplary mesh formations, in accordance with various embodiments.

FIG. 9A illustrates an exemplary mesh formation of an electrode as a straight winding, in accordance with various embodiments. This straight winding mesh formation 900A may represent a single elongated electrode that traverses a two dimensional space (e.g., along a surface of a layer of the piezoelectric component 902A).

FIG. 9B illustrates an exemplary mesh formation of an electrode as a curved winding, in accordance with various embodiments. This curved winding mesh formation 900B may represent a single elongated electrode that winds in a curved manner (e.g., more curved than the above referenced straight winding) along a two dimensional space (e.g., along a surface of another layer of the piezoelectric component 902B).

FIG. 9C illustrates an exemplary mesh formation of an electrode as a zig-zag winding, in accordance with various embodiments. This zig-zag winding mesh foil cation 900C may represent a single elongated electrode that winds in a zig-zag manner along a two dimensional space (e.g., along a surface of another layer of the piezoelectric component 902B).

FIG. 9D illustrates an exemplary mesh formation of an electrode as a one sided bowled winding, in accordance with various embodiments. This one sided bowled winding mesh formation 900D may represent a single elongated electrode that winds in a one sided bowled manner along a two dimensional space (e.g., along a surface of another layer of the piezoelectric component 902D). The one sided bowled manner may refer to intermediate bowl or half circular formations 904D that bowl out toward one direction.

Figures 9E, 9F, 9G, 9H:
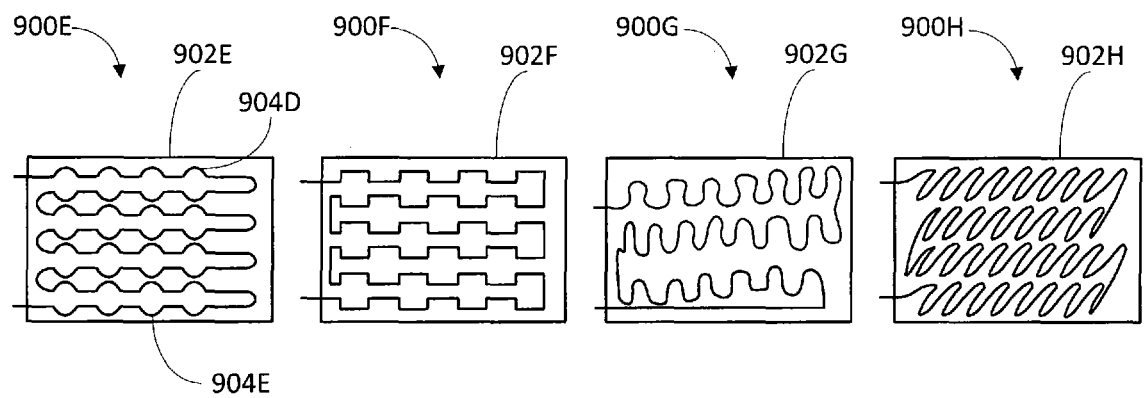
FIG. 9E illustrates an exemplary mesh formation of an electrode as a two sided bowled winding, in accordance with various embodiments.
FIG. 9F illustrates an exemplary mesh formation of an electrode as a sharp winding, in accordance with various embodiments.
FIG. 9G illustrates an exemplary mesh formation of an electrode as a partial curved winding, in accordance with various embodiments.
FIG. 9H illustrates an exemplary mesh formation of an electrode as a deep curved winding, in accordance with various embodiments.

FIG. 9E illustrates an exemplary mesh formation of an electrode as a two sided bowled winding, in accordance with various embodiments. This two sided bowled winding mesh formation 900E may represent a single elongated electrode that winds in a two sided bowled manner along a two dimensional space (e.g., along a surface of another layer of the piezoelectric component 902E). The two sided bowled manner may refer to intermediate bowl or half circular formations 904E that bowl out toward two directions.

FIG. 9F illustrates an exemplary mesh formation of an electrode as a sharp winding, in accordance with various embodiments. This sharp winding mesh formation 900F may represent a single elongated electrode that winds in a sharp manner (e.g., at an acute angle of around 90 degrees) along a two dimensional space (e.g., along a surface of another layer of the piezoelectric component 902F).

FIG. 9G illustrates an exemplary mesh formation of an electrode as a partial curved winding, in accordance with various embodiments. This partial curved winding mesh formation 900G may represent a single elongated electrode that winds in a curved manner (e.g., more curved than the above referenced straight winding) partially along a two dimensional space (e.g., along a surface of another layer of the piezoelectric component 902G).

FIG. 9H illustrates an exemplary mesh formation of an electrode as a deep curved winding, in accordance with various embodiments. This deep curved winding mesh formation 900H may represent a single elongated electrode that winds in a deeply curved manner (e.g., more curved than the above referenced curved winding) along a two dimensional space (e.g., along a surface of another layer of the piezoelectric component 902H).

Figures 9I, 9J, 9K, 9L:
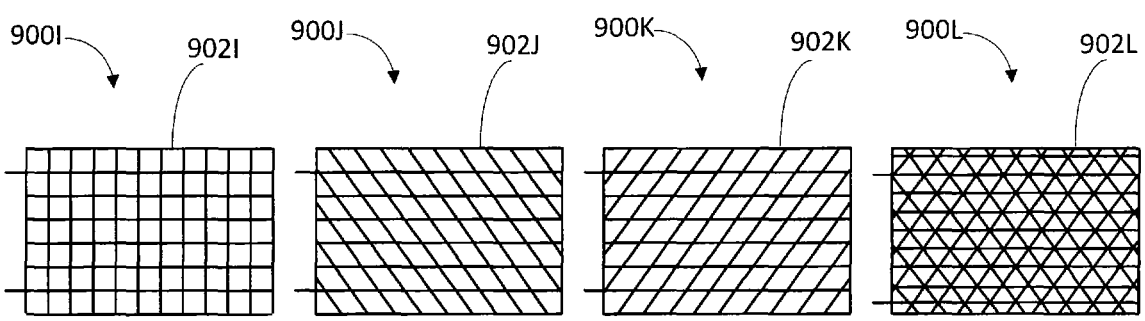
FIG. 9I illustrates an exemplary mesh formation of an electrode as a grid, in accordance with various embodiments.
FIG. 9J illustrates an exemplary mesh formation of an electrode as a backslash grid, in accordance with various embodiments.
FIG. 9K illustrates an exemplary mesh formation of an electrode as a forward slash grid, in accordance with various embodiments.
FIG. 9L illustrates an exemplary mesh formation of an electrode as a back and forward slash grid, in accordance with various embodiments.

FIG. 9I illustrates an exemplary mesh formation of an electrode as a grid, in accordance with various embodiments. This grid mesh formation 900I may represent an elongated electrode in a grid formation along a two dimensional space (e.g., along a surface of another layer of the piezoelectric component 902I).

FIG. 9J illustrates an exemplary mesh formation of an electrode as a backslash grid, in accordance with various embodiments. This backslash grid mesh formation 900J may represent an elongated electrode in a backslash grid formation along a two dimensional space (e.g., along a surface of another layer of the piezoelectric component 902J).

FIG. 9K illustrates an exemplary mesh formation of an electrode as a forward slash grid, in accordance with various embodiments. This forward slash grid mesh formation 900K may represent an elongated electrode in a forward slash grid formation along a two dimensional space (e.g., along a surface of another layer of the piezoelectric component 902K).

FIG. 9L illustrates an exemplary mesh formation of an electrode as a back and forward slash grid, in accordance with various embodiments. This back and forward slash grid mesh formation 900L may represent an elongated electrode in a back and forward slash grid formation along a two dimensional space (e.g., along a surface of another layer of the piezoelectric component 902L).

Figures 9M, 9N, 9O, 9P:
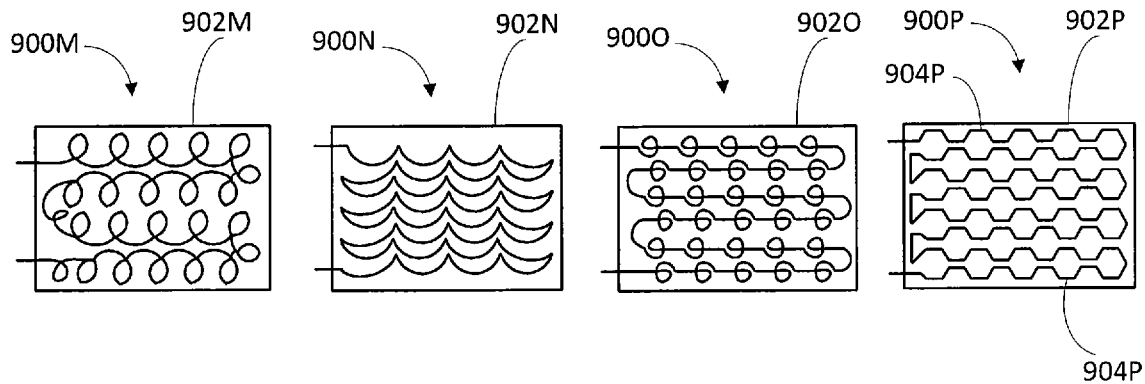
FIG. 9M illustrates an exemplary mesh formation of an electrode as a looping winding, in accordance with various embodiments.
FIG. 9N illustrates an exemplary mesh formation of an electrode as a pointed winding, in accordance with various embodiments.
FIG. 9O illustrates an exemplary mesh formation of an electrode as a complex looped winding, in accordance with various embodiments.
FIG. 9P illustrates an exemplary mesh formation of an electrode as a two sided segmented bowled winding, in accordance with various embodiments.
Figure 9Q:
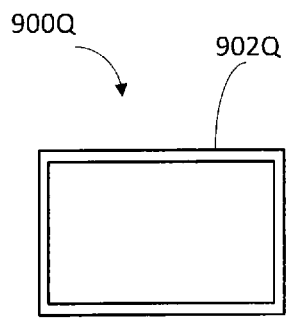
FIG. 9Q illustrates an exemplary mesh formation of an electrode as a monolith, in accordance with various embodiments.

FIG. 9M illustrates an exemplary mesh formation of an electrode as a looping winding, in accordance with various embodiments. This looping winding mesh formation 900M may represent a single elongated electrode that winds in a looping manner along a two dimensional space (e.g., along a surface of another layer of the piezoelectric component 902M).

FIG. 9N illustrates an exemplary mesh formation of an electrode as a pointed winding, in accordance with various embodiments. This pointed winding mesh formation 900N may represent a single elongated electrode that winds in a pointed manner (e.g., with points or acute angles facing one direction) along a two dimensional space (e.g., along a surface of another layer of the piezoelectric component 902N).

FIG. 9O illustrates an exemplary mesh formation of an electrode as a complex looped winding, in accordance with various embodiments. This complex looped winding mesh formation 900O may represent a single elongated electrode that winds in a complex looped manner (e.g., with loops more complex than the looping manner referenced above) along a two dimensional space (e.g., along a surface of another layer of the piezoelectric component 902O).

FIG. 9P illustrates an exemplary mesh formation of an electrode as a two sided segmented bowled winding, in accordance with various embodiments. This two sided segmented bowled winding mesh formation 900P may represent a single elongated electrode that winds in a two sided segmented bowled manner along a two dimensional space (e.g., along a surface of another layer of the piezoelectric component 902P). The two sided segmented bowled manner may refer to bowled winding that is formed of straight segments 904P that bowl out toward two directions.

FIG. 9Q illustrates an exemplary mesh formation of an electrode as a monolith, in accordance with various embodiments. This monolithic mesh formation 900Q may represent an electrode formed as a monolith (e.g., as a plate) along a two dimensional space (e.g., along a surface of another layer of the piezoelectric component 902Q).

The various mesh formations shown in FIGS. 9A-9Q, as discussed above, are exemplary and not intended to limit the mesh formations that may be utilized in various embodiments of the invention. The different mesh formations provide/allow various strain relief/fatigue failure tolerance based on the geometry and configuration of the piezoelectric material. The strain induced, and thus the energy generated on the piezo will be affected by the mesh formation and can be optimized using one or more embodiments of the aforementioned configurations.

Figure 10A:
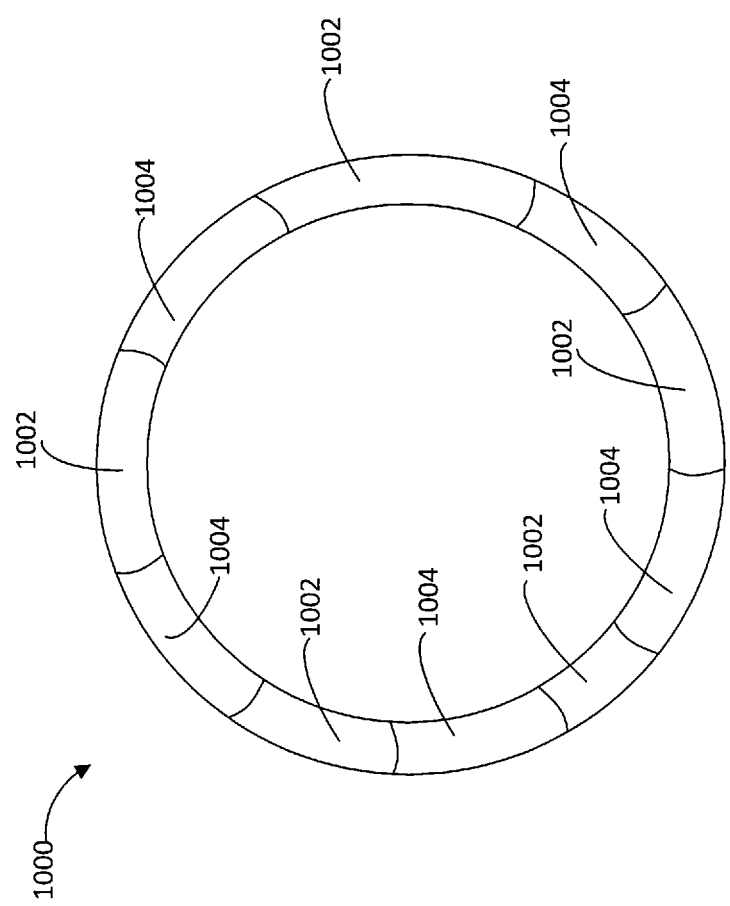
FIG. 10A illustrates a ring formation of energy harvesters with an active/passive bank feature, in accordance with various embodiments.

FIG. 10A illustrates a ring formation of energy harvesters with an active/passive bank feature, in accordance with various embodiments. The ring formation of energy harvesters 1000 may form a concentric loop that matches a circumference of a rotatable component (not shown) to which it may be coupled. In certain embodiments, this ring formation of energy harvesters 1000 may form an active/passive bank feature where the energy harvesters 1002 (e.g., active banks) are connected via a bridge 1004 (e.g., a passive bank). In certain embodiments, the bridge 1004 or passive bank may be a substrate without a piezoelectric component. In other embodiments, the bridge 1004 or passive bank may include an energy storage medium, such as a rechargeable battery in electrical communication with an electrical conduction component of the energy harvesters 1002.

Figure 10B:
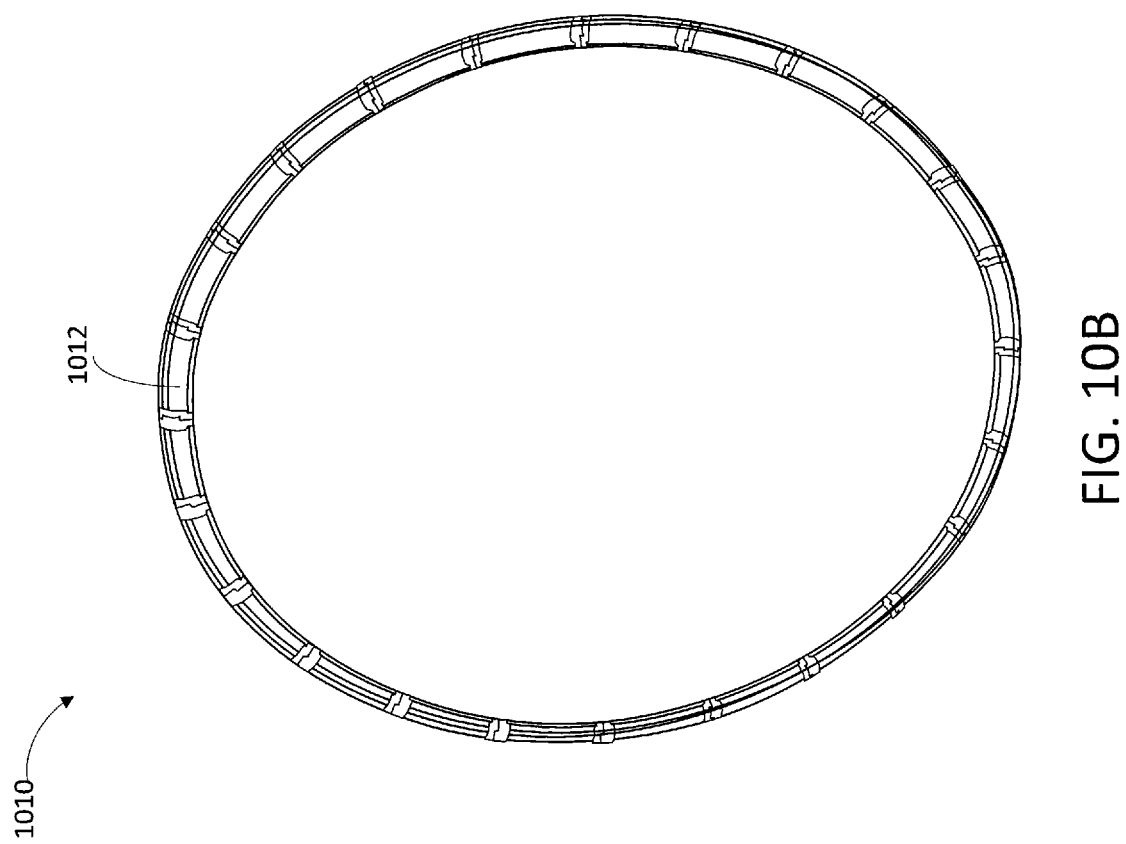
FIG. 10B illustrates a ring formation of energy harvesters with an interlocking feature, in accordance with various embodiments.

FIG. 10B illustrates a ring formation 1010 of energy harvesters 1012 with an interlocking feature, in accordance with various embodiments. The ring formation 1010 of energy harvesters 1012 may form a concentric loop that matches a circumference of a rotatable component (not shown) to which it may be coupled. In certain embodiments, this ring formation 1010 of energy harvesters 1012 may be formed of energy harvesters 1012 that include an interlocking feature that interlocks or connects different energy harvesters 1012 together, as described in further detail below.

Figure 10C:
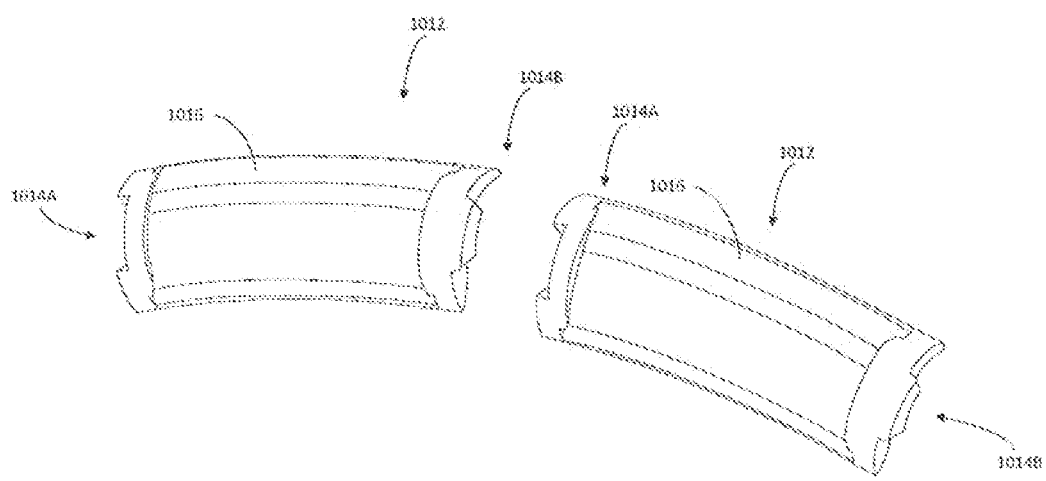
FIG. 10C illustrates disconnected energy harvesters of the ring formation of energy harvesters with an interlocking feature, in accordance with various embodiments.

FIG. 10C illustrates disconnected energy harvesters of the ring formation of energy harvesters with an interlocking feature, in accordance with various embodiments. These energy harvesters 1012 may include an interlocking feature that interlocks or connects different energy harvesters 1012 together. This interlocking features may include, for example, physical interconnection features 1014A, 1014B on a substrate 1016 of the energy harvester 1012. The physical interconnection features 1014A, 1014B may be utilized to physically connect different energy harvesters 1012 together via their substrates 1016. For example, different substrates 1016 may have either a female-type (e.g., concave) physical interconnection feature 1014A or a male-type (e.g., convex) physical interconnection feature 1014B. The convex physical interconnection feature 1014B may be configured to mate and interconnect with the concave physical interconnection feature 1014A.

Also illustrated in FIG. 10C is a curved staging surface 1018 (e.g., a staging surface within a micro cavity or depression) of the substrate 1016. In some embodiments, the curved staging surface 1018 is curved in only two dimensions (e.g., the height and width dimensions). As noted above, a piezoelectric component may incur strain to deform and conform to the two dimensional curved staging surface 1018. Accordingly, the rectangular piezoelectric component may be configured to bend within and toward the two-dimensional curved staging surface 1018. In certain embodiments, the two-dimensional curved staging surface 412 may be a convex surface.

Figure 10D:
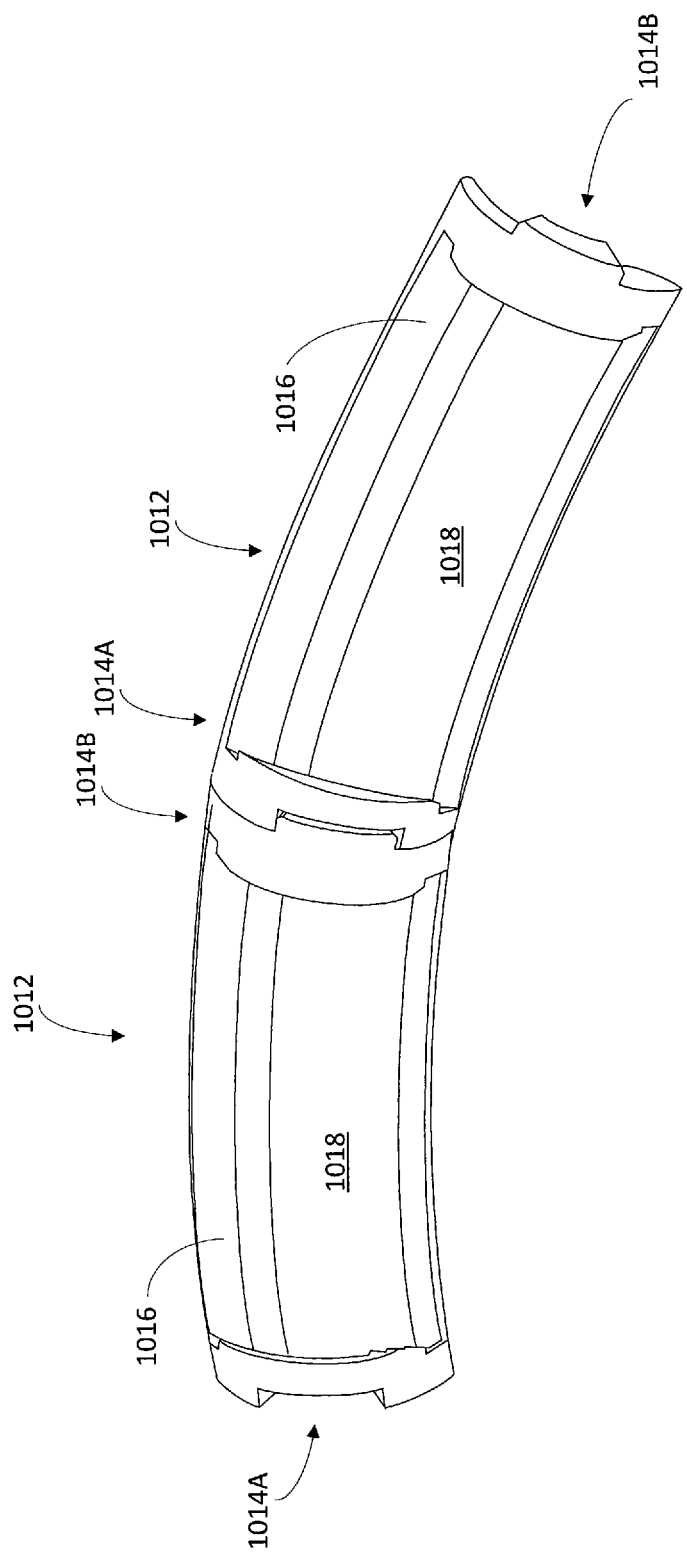
FIG. 10D illustrates connected energy harvesters of the ring formation of energy harvesters with an interlocking feature, in accordance with various embodiments.

FIG. 10D illustrates connected energy harvesters of the ring formation of energy harvesters with an interlocking feature, in accordance with various embodiments. As illustrated in FIG. 10D, the convex physical interconnection feature 1014B of one substrate 1016 may be interconnected with the concave physical interconnection feature 1014A of another substrate 1016 to form connected energy harvesters.

Figure 10E:
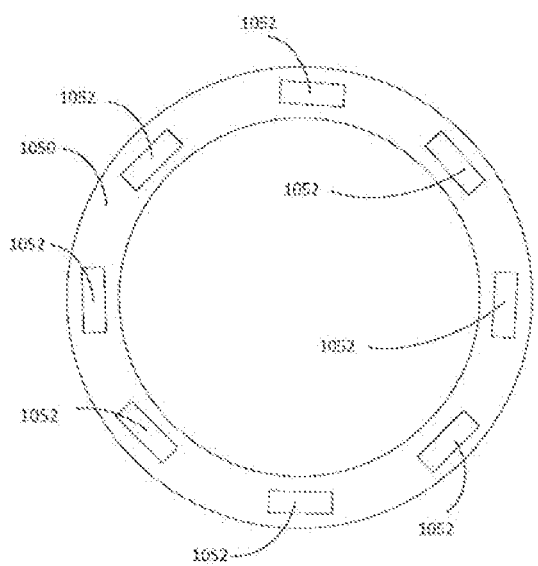
FIG. 10E illustrates connected energy harvesters of a continuous ring formation, in accordance with various embodiments.

FIG. 10E illustrates connected energy harvesters of a continuous ring formation, in accordance with various embodiments. The continuous ring formation 1050 may form a concentric loop with a circumference of a rotatable component. In certain embodiments, this continuous ring formation 1050 may include energy harvesters 1052 that include only a piezoelectric component without a separate substrate. For example, the continuous ring formation 1050 may include respective energy harvesters 1052 at regions of the continuous ring formation 1050 with two-dimensional (e.g., two of a length, a height and a width) curved staging surfaces (e.g., a micro cavity or depression in the surface of the ring 1050) in which a piezoelectric component is located. As noted above, the piezoelectric component may incur strain to deform and conform to the two dimensional curved staging surface.

Figure 11A:
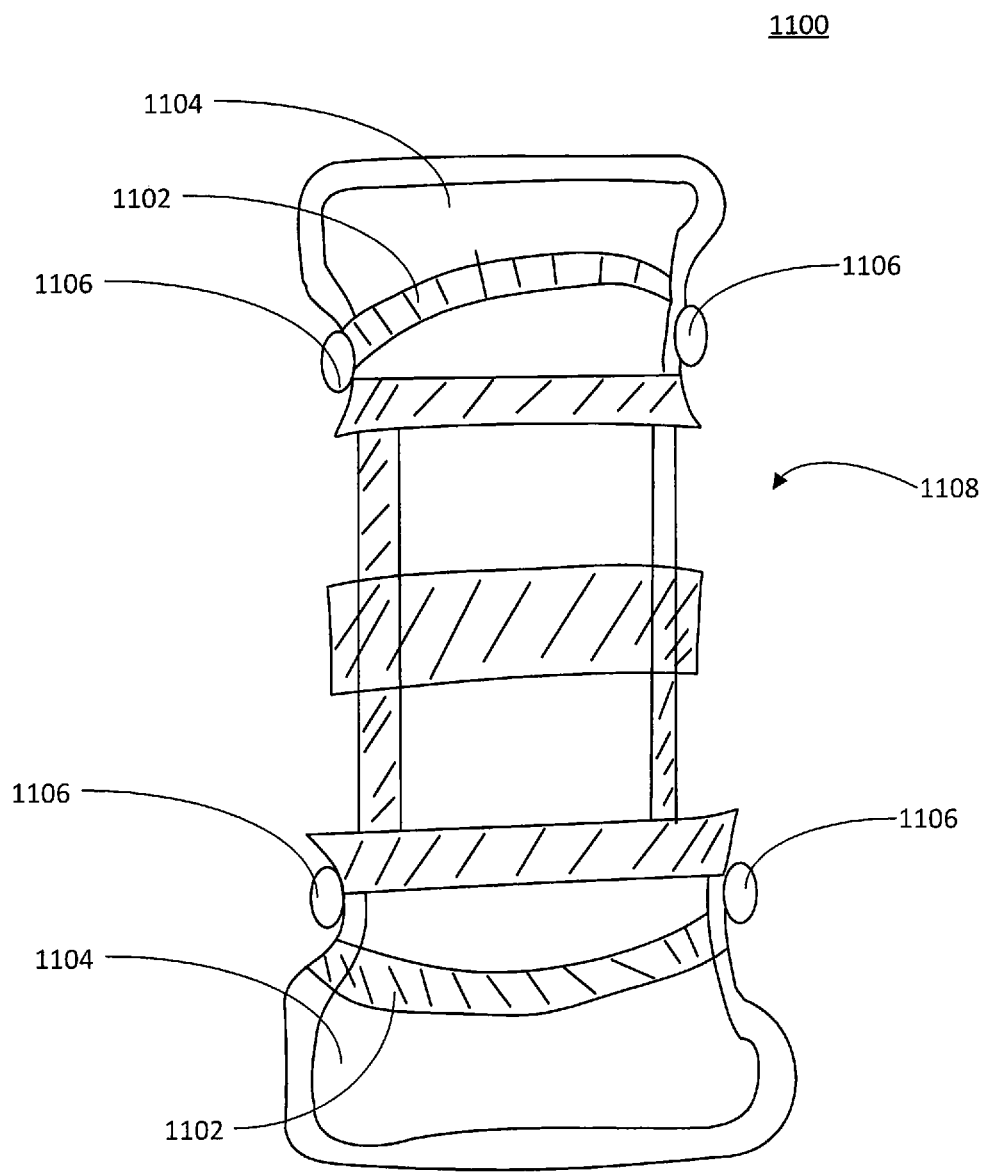
FIG. 11A illustrates a plan cross sectional view of an energy harvester energy connector that runs within a tire, in accordance with various embodiments.

FIG. 11A illustrates a plan cross sectional view 1100 of an energy harvester energy connector 1102 that runs within a tire 1104, in accordance with various embodiments. The energy harvester energy connector 1102 may be a wire or other conductive element that connects the interconnects of different energy harvesters 1106 together. Accordingly, the energy harvester energy connector 1102 may aggregate the collected energy of the various energy harvesters 1106 together along the energy harvester energy connector 1102. As illustrated, the energy harvester energy connector 1102 may run within the tire 1104 (e.g., within a pressurized region of a tire 1104) as it traverses between energy harvesters 1106 that are positioned on a rotatable component 1108.

Figure 11B:
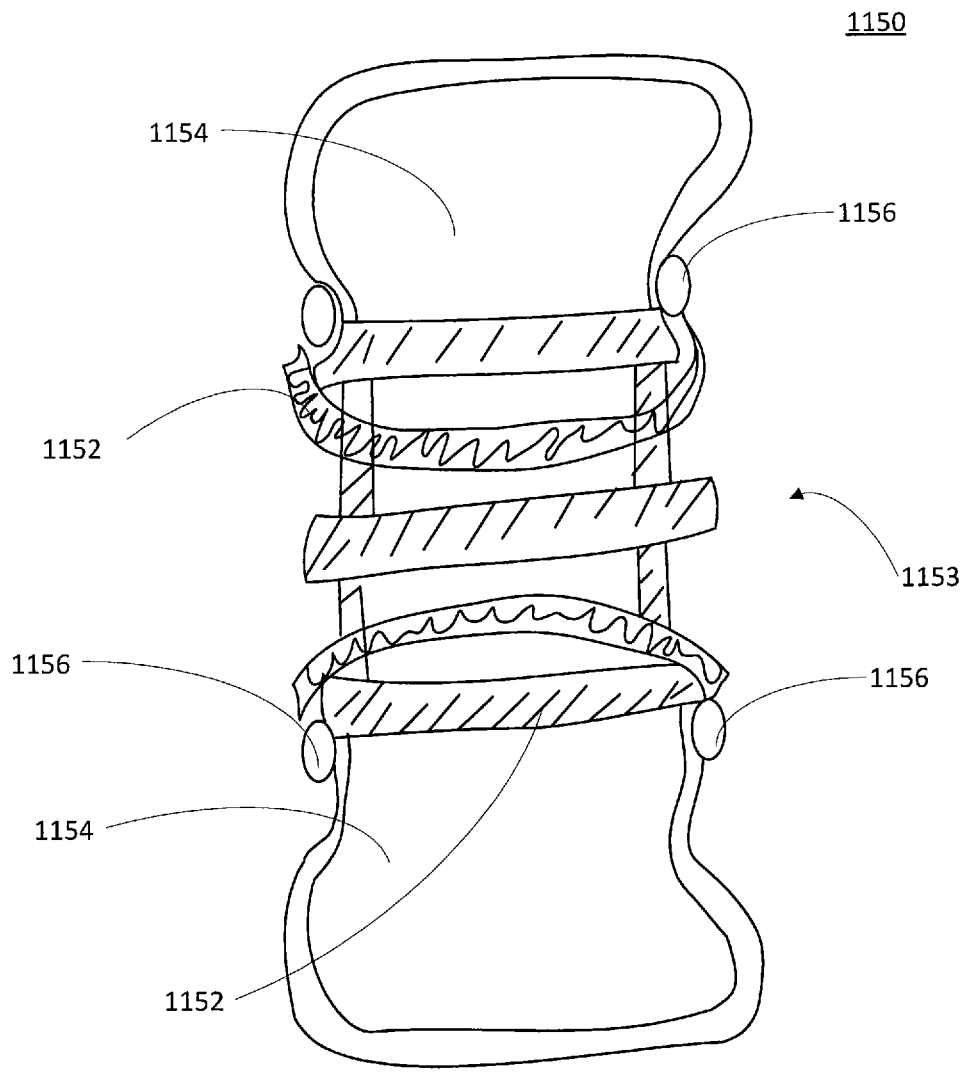
FIG. 11B illustrates a plan cross sectional view of an energy harvester energy connector that runs within a rotatable component, in accordance with various embodiments.

FIG. 11B illustrates a plan cross sectional view 1150 of an energy harvester energy connector 1152 that runs within a rotatable component 1153, in accordance with various embodiments. As noted above, one example of the rotatable component 1153 is a rim. The energy harvester energy connector 1152 may be a wire or other conductive element that connects the interconnects of different energy harvesters 1156 (represented as dots) together. Accordingly, the energy harvester energy connector 1152 may aggregate the collected energy of the various energy harvesters 1156 together along the energy harvester energy connector 1152. As illustrated, the energy harvester energy connector 1152 may run within the rotatable component 1153 (e.g., not within a pressurized region of a tire 1154) as it traverses between energy harvesters 1156 that are positioned on the rotatable component 1158.

FIG. 12A illustrates an energy harvester 1202 disposed on a spoke 1204 of an airless tire 1206, in accordance with various embodiments. The airless tire 1206 may be a non-pneumatic tire (NPT), or flat-free tire that is not supported by air pressure. The airless tire 1206 may include spokes 1204 that radiate from a rotatable component 1208. These spokes 1204 may bend as the airless tire 1206 incurs a load and/or rotates (e.g., rotates under a load).

In various embodiments, an energy harvester 1202 may only include a piezoelectric component without a substrate. For example, such energy harvesters 1202 may refer to a piezoelectric component placed on a part of the airless tire 1206 with a two-dimensional (e.g., two of a length, a height and a width) curved staging surface that is part of a spoke 1204 of the airless tire 1206.

Figure 12B:
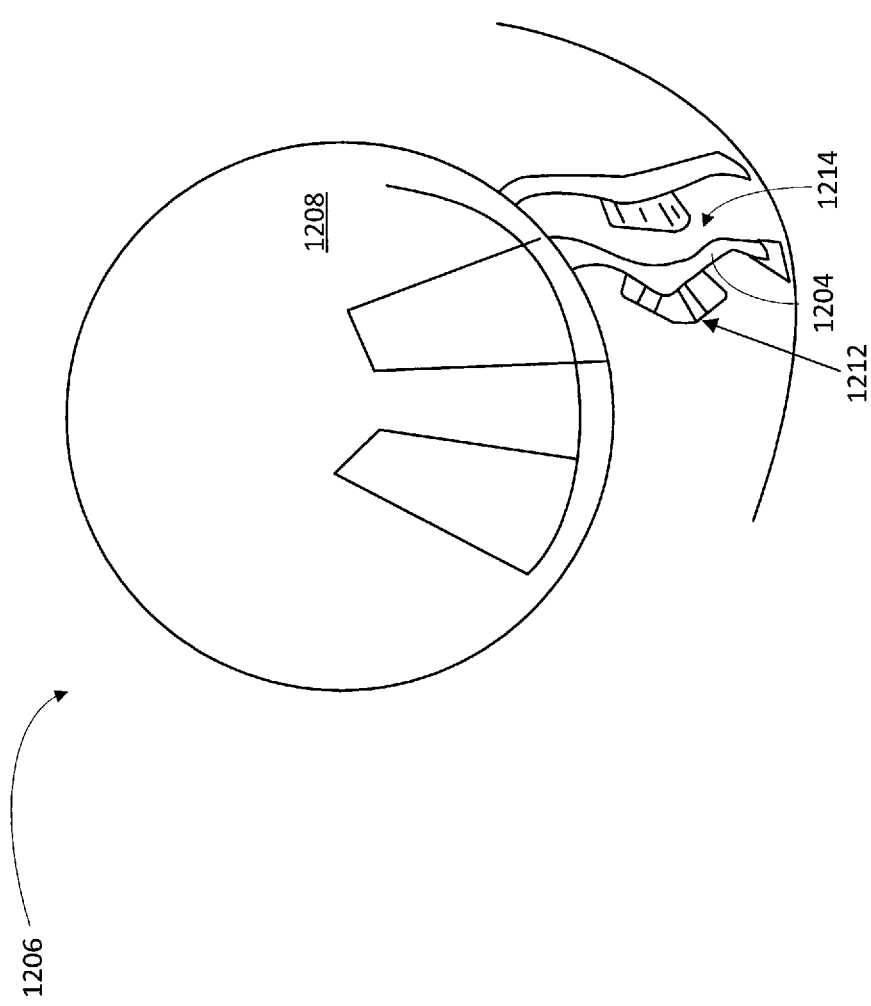
FIG. 12B illustrates an energy harvester disposed on a joint of the spoke of an airless tire 1206, in accordance with various embodiments.

FIG. 12B illustrates an energy harvester 1212 disposed on a joint 1214 of the spoke 1204 of an airless tire 1206, in accordance with various embodiments. As noted above, the airless tire 1206 may include spokes 1204 that radiate from a rotatable component 1208. These spokes 1204 may bend as the airless tire 1206 incurs a load and/or rotates (e.g., rotates under a load). Also, these spokes 1204 may include a joint 1214, which may be a part of the spoke 1204 that is bent in a resting position (e.g., when not biased) and thus may be prone to greater bending when biased compared to the remaining portions of the spoke 1204.

In various embodiments, the energy harvesters 1212 may only include a piezoelectric component without a substrate. For example, such energy harvesters 1212 may refer to a piezoelectric component placed on a part of the airless tire 1206 with a two-dimensionally curved staging surface that is part of a joint 1214 of the spoke 1204 of the airless tire 1206.

Figure 12C:
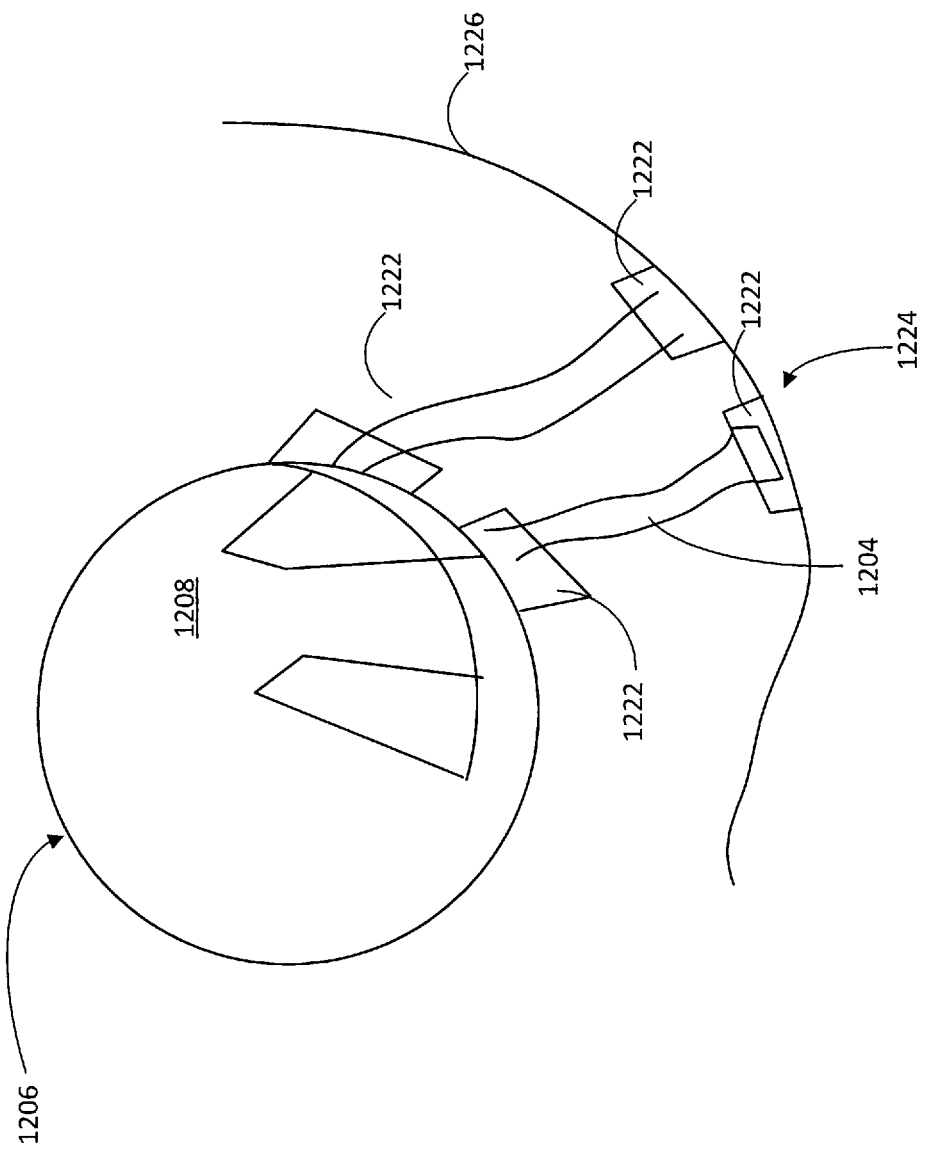
FIG. 12C illustrates an energy harvester disposed around a terminus region of the spoke 1204 of the airless tire, in accordance with various embodiments.

FIG. 12C illustrates an energy harvester 1222 disposed around a terminus region 1224 of the spoke 1204 of the airless tire 1206, in accordance with various embodiments. As noted above, the airless tire 1206 may include spokes 1204 that radiate from a rotatable component 1208. These spokes 1204 may bend as the airless tire 1206 incurs a load and/or rotates (e.g., rotates under a load). Also, these spokes 1204 may include a terminus region 1224, which may be around a part of the spoke 1204 that terminates (e.g., terminates at the rotatable component 1208 or terminates at an outer circumference 1226). This terminus region 1224 may incur strain when the airless tire 1206 incurs a load and/or rotates (e.g., rotates under a load).

In various embodiments, the energy harvesters 1222 may include a piezoelectric component placed on a two-dimensional (e.g., two of a length, a height and a width) curved staging surface (e.g., a micro cavity or depression). This two-dimensional curved staging surface may be provided by a cavity into which the piezoelectric component may bend when strain is incurred (e.g., when biased). This two-dimensional curved staging surface may be proximate to the terminus and may be either directly formed as part of the airless tire 1206 or be on a substrate in order to facilitate the application of strain onto the piezoelectric component.

Figure 13A:
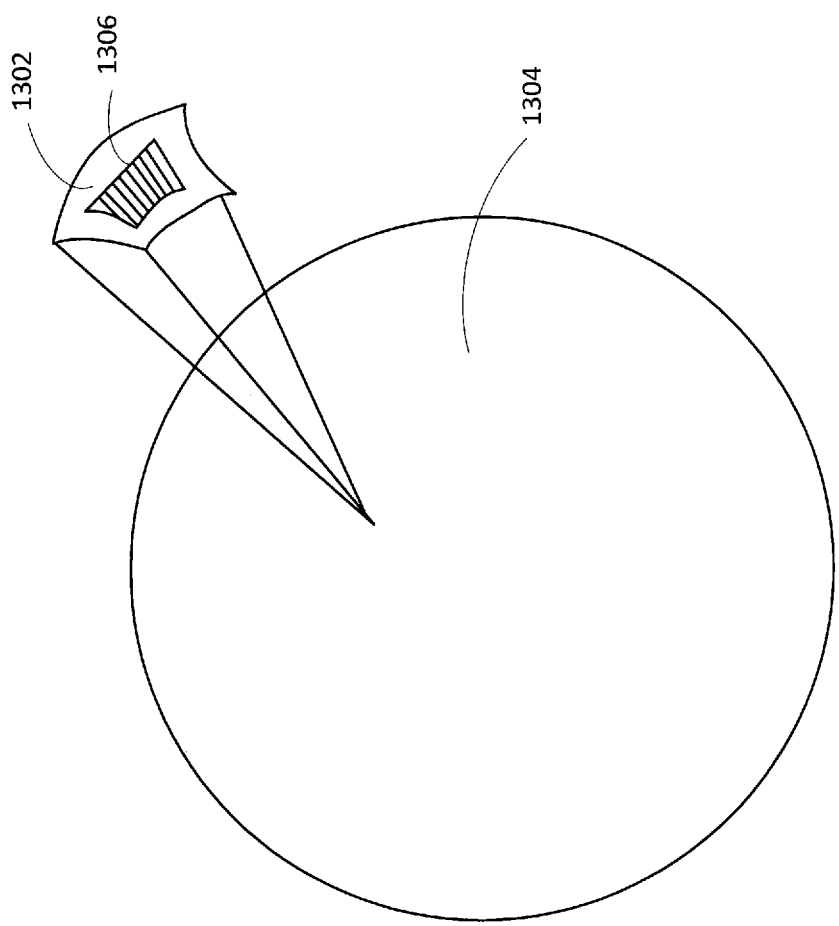
FIG. 13A illustrates an energy harvester disposed on a spherical wheel, in accordance with various embodiments.

FIG. 13A illustrates an energy harvester 1302 disposed on a spherical wheel, in accordance with various embodiments. The spherical wheel may be a wheel that is formed as a sphere. In various embodiments, energy harvesters 1302 may be disposed along a spherical wheel outer surface 1304 (a surface of the spherical wheel that contacts, or that is proximate to, a point of contact with an underlying surface (e.g., ground) that the spherical wheel may rotate or roll against). In FIG. 13A, a view of the energy harvestor 1302 on the spherical surface 1304 is magnified for purposes of illustration. This spherical wheel outer surface 1304 may incur a load at a point at which the outer surface contacts an underlying surface (e.g., ground).

In various embodiments, the energy harvesters 1302 may include a piezoelectric component 1306 placed on a two-dimensional (e.g., two of a length, a height and a width) curved staging surface (e.g., a micro cavity or depression that the piezoelectric component 1306 may deform into). Accordingly, this two-dimensional curved staging surface may be part of a cavity into which the piezoelectric component 1306 may bend when strain is incurred (e.g., when biased). This two-dimensional curved staging surface may be along the spherical wheel outer surface 1304 and may be either directly formed as part of the spherical wheel outer surface 1304 or be on a substrate connected (e.g., adhered) to or otherwise proximate the spherical wheel outer surface 1304 in order to facilitate the application of strain onto the piezoelectric component 1306.

Figure 13B:
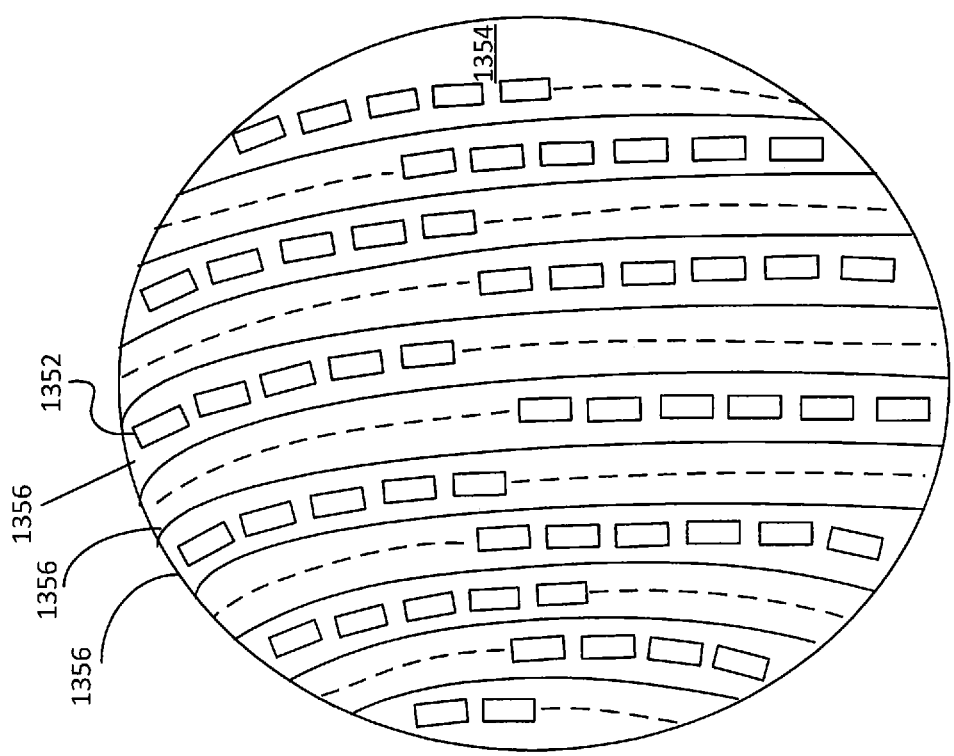
FIG. 13B illustrates energy harvesters disposed on a spherical wheel in a band formation, in accordance with various embodiments.

FIG. 13B illustrates energy harvesters 1352 disposed on a spherical wheel in a band formation, in accordance with various embodiments. The spherical wheel may be a wheel that is formed as a sphere. In various embodiments, energy harvesters 1352 may be disposed along a spherical wheel outer surface 1354 (a surface of the spherical wheel that contacts, or that is proximate to, a point of contact with an underlying surface (e.g., ground) that the spherical wheel may rotate or roll against). This spherical wheel outer surface 1354 may incur a load at a point at which the outer surface contacts an underlying surface.

In various embodiments, the energy harvesters 1352 may include a piezoelectric component placed with a two-dimensional (e.g., two of a length, a height and a width) curved staging surface (e.g., with a micro cavity or depression that the piezoelectric component 1306 may deform into). This two-dimensional curved staging surface may form a cavity into which the piezoelectric component may bend when strain is incurred (e.g., when biased). Accordingly, this two-dimensional curved staging surface may be along the spherical wheel outer surface 1354 and may be either directly formed as part of the spherical wheel outer surface 1354 or be on a substrate connected (e.g., adhered) to or otherwise proximate the spherical wheel outer surface 1304 in order to facilitate the application of strain onto the piezoelectric component.

In certain embodiments, the energy harvesters 1352 may be formed with band formations 1356 where different energy harvesters within a band formation (e.g., around relative concentric circumferences) are related but different energy harvesters outside of a band formation are not. The lines representing the band formations may not be physically noticeable on the spherical wheel outer surface 1354 but are illustrated in FIG. 13B for ease of explanation. By being related, the energy harvesters within a band formation may be related in that they are of a same shape, a same size, a same distance from each other, or have any other physical similarity to each other. Also, in further embodiments, energy harvesters 1352 within a band formation 1356 may be electrically coupled together, such as by being electrically coupled together via an energy harvester energy connector. In various embodiments, a collection of these energy harvesters 1352 in band formations 1356 may cover an entire spherical wheel outer surface 1354. In certain embodiments, different band formations 1356 may have different sizes (e.g., circumferences) such that they also constitute a different number of energy harvesters. In particular embodiments, a band formation 1356 may have only a single energy harvester but may still be referred to as a band formation to contrast with other band formations 1356 along the spherical wheel outer surface 1354.

Figure 14:
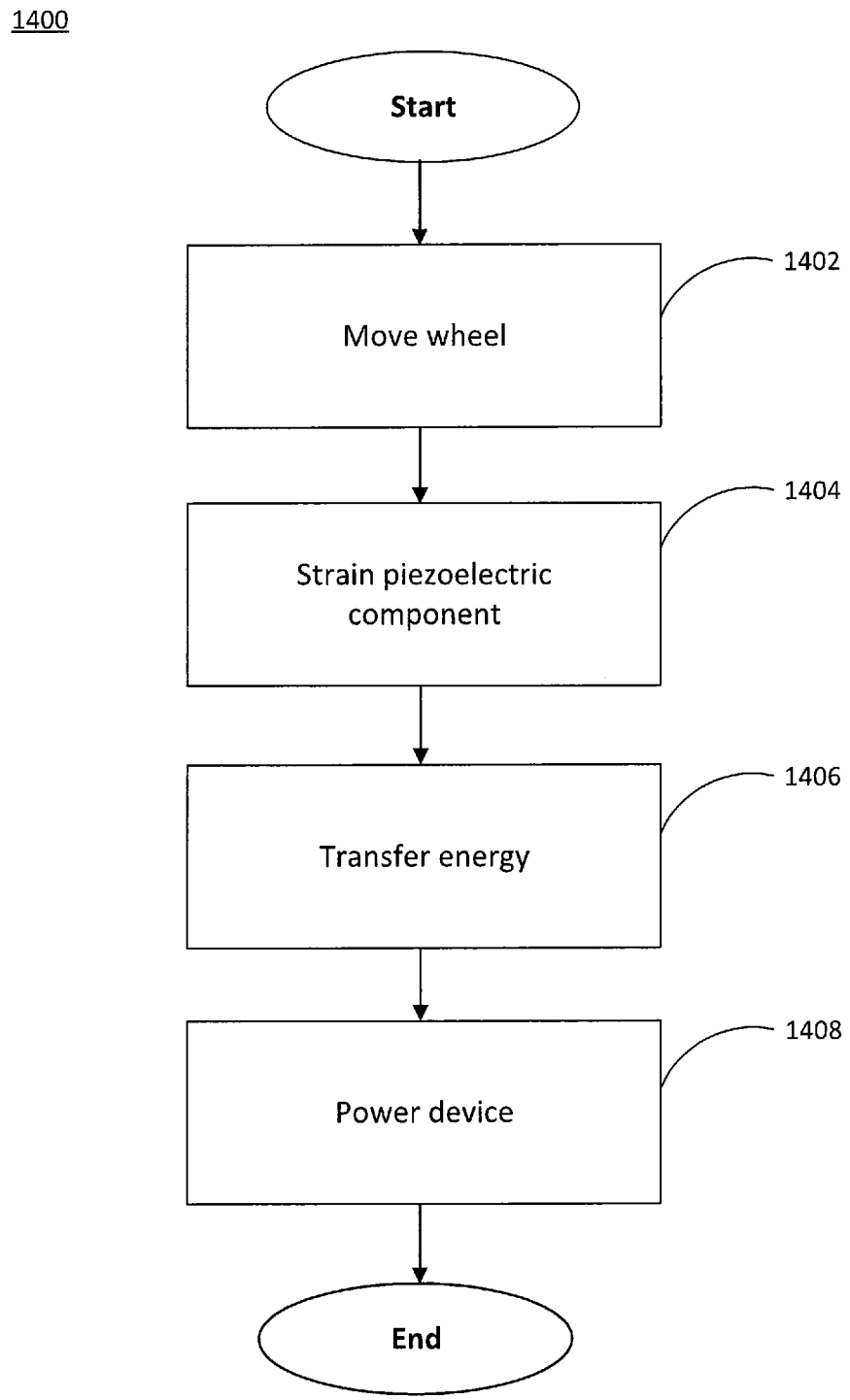
FIG. 14 is a flow chart of an energy harvester process, in accordance with various embodiments.

FIG. 14 is a flow chart of an energy harvester process 1400, in accordance with various embodiments. The process 1400 may be performed at a smart wheel sensor system that integrates an energy harvester and at least one device configured to be powered by the energy harvester, as introduced above. It is noted that the process 1400 is merely an example, and is not intended to limit the present disclosure. Accordingly, it is understood that additional operations (e.g., blocks) may be provided before, during, and after the process 1400 of FIG. 14, certain operations may be omitted, certain operations may be performed concurrently with other operations, and that some other operations may only be briefly described herein.

At block 1402, a wheel may be moved (e.g., rotated) under a load (e.g., a load of the wheel itself or a wheel driven object (e.g., a vehicle)). As noted above, this wheel may be a smart wheel or a smart wheel sensor system that integrates an energy harvester and at least one device configured to be powered by the energy harvester. The energy harvester includes a piezoelectric component placed on a curved staging surface. This curved staging surface may be part of a cavity into which the piezoelectric component may bend when strain is incurred (e.g., when biased). This curved staging surface may be either directly formed as part of the wheel or on a substrate mounted on part of the wheel in order to facilitate the application of strain onto the piezoelectric component.

Furthermore, this energy harvester may include a piezoelectric component that includes a piezoelectric material layer and at least one electrode layer. Also, the piezoelectric component may be connected with an interconnect and an electrical conduction component. This piezoelectric material layer may produce energy when mechanically deformed. The electrode layer may capture the energy produced by the piezoelectric material layer. The electrode layer may be connected via the interconnect to the electrical conduction component. The interconnect may be a flexible structure that connects the piezoelectric component to the electrical conduction component so that the electrical conduction component may channel and offload the energy produced by the piezoelectric component. This electrical conduction component may be connected with other devices of a device platform (e.g., an energy storage medium or a sensor of the smart wheel sensor system) to provide power to the other devices of the device platform.

At block 1404, the piezoelectric component of the energy harvester may deform (e.g., mechanically deform) to generate energy resulting from compressive force due to wheel rotation (e.g., a vehicle, acting on the bead area of the tire mounted on the rotatable component). Stated another way, the piezoelectric component may capture a kinetic energy of a transport moving in response to the rotatable component rotating. Accordingly, the piezoelectric component may generate energy when mechanical stress is applied to the piezoelectric component. For example, this energy may be in the form of an alternating current (AC) signal, which can be rectified into a direct current (DC) signal. Stated another way, the bending strain experienced at the piezoelectric component may generate energy (e.g., an AC voltage) with a frequency proportional to the rotational frequency of the wheel.

At block 1406, the energy generated by the energy harvester may be transferred to a device of the smart wheel sensor system. As noted above, this energy may be transferred by, for example, the electrical conduction component to the device. The electrical conduction component may be any type of conductor configured to transfer the energy produced by the energy harvester, such as a wire, a ribbon, or a pin made of a conductive material to transfer the energy from the energy harvester to the device.

At block 1408, the device connected with the electrical conduction component may be powered by the energy generated by the energy harvester. This device may be, for example, an energy storage medium or a sensor of the smart wheel sensor system. Accordingly, the energy harvester may be part of a smart wheel sensor system to provide power for least one energy storage medium or sensor of the smart wheel sensor system. The smart wheel sensor system may include multiple types of sensors, which may each be configured to collect different types of smart wheel sensor system data. For example, the smart wheel sensor system may include a height sensor configured to produce barometric pressure sensor data and/or deflection of an inner surface of a tire, as discussed above; an acoustic sensor configured to produce acoustic sensor data; an image sensor configured to produce image sensor data; a gas sensor configured to produce gas sensor data; a magnetic sensor configured to produce magnetic sensor data; an accelerometer sensor configured to produce acceleration sensor data; a gyroscope sensor configured to produce gyroscopic sensor data; and a humidity sensor configured to produce humidity sensor data.

Figure 15:
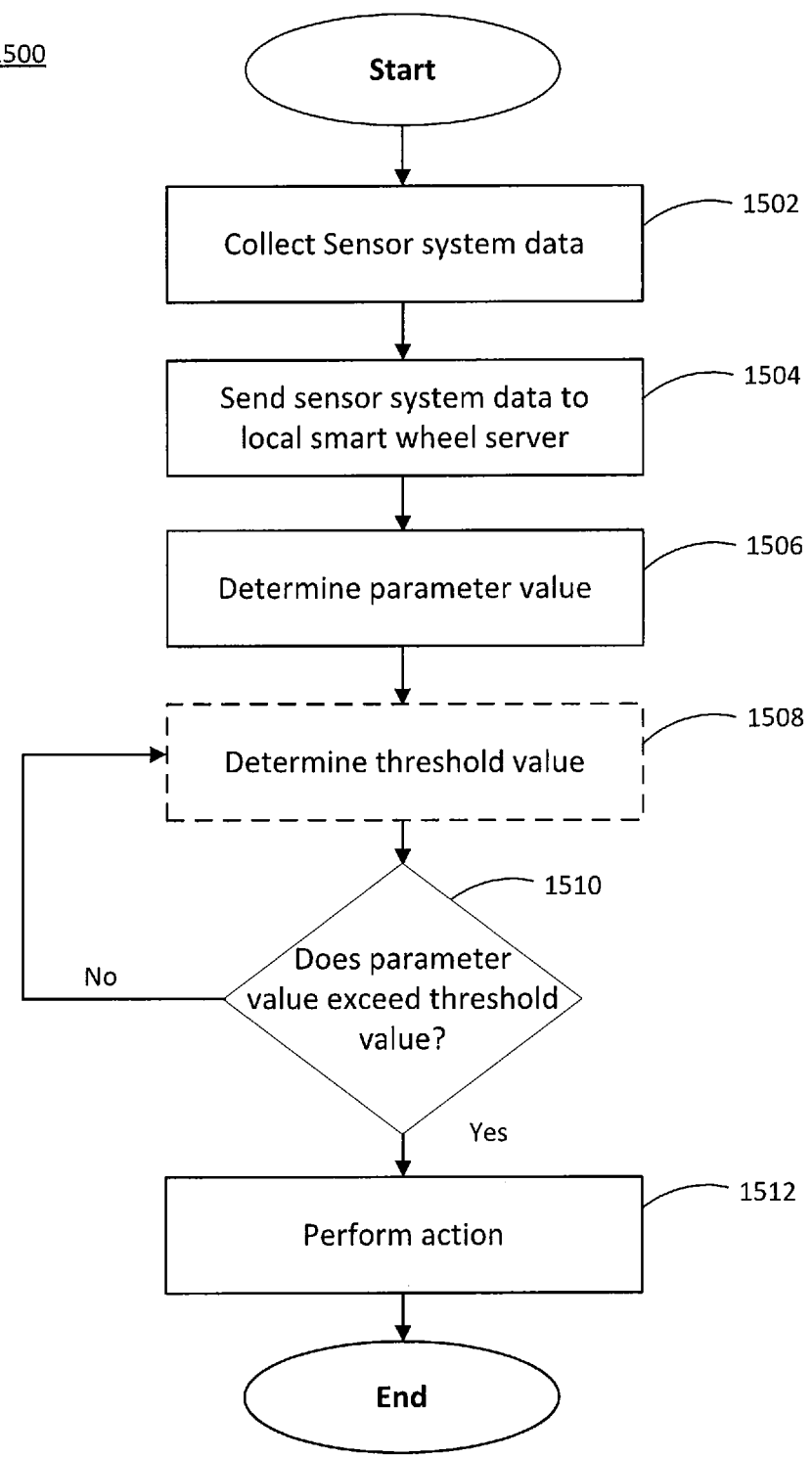
FIG. 15 is a flow chart of a smart wheel process, in accordance with various embodiments.

As noted above, in various embodiments the device powered by an energy harvester may be smart wheel sensor of a smart wheel sensor system. FIG. 15 is a flow chart of a smart wheel process 1500, in accordance with various embodiments. The process 1500 may be performed at a smart wheel sensor system that includes a device powered by the energy harvester and in communication with a local smart wheel server, as introduced above. It is noted that the process 1500 is merely an example, and is not intended to limit the present disclosure. Accordingly, it is understood that additional operations (e.g., blocks) may be provided before, during, and after the process 1500 of FIG. 15, certain operations may be omitted, certain operations may be performed concurrently with other operations, and that some other operations may only be briefly described herein.

At block 1502, smart wheel sensor system data may be collected locally from various devices that are sensors powered by at least one energy harvester. As discussed above, a smart wheel may be a wheel of a vehicle with a local network connected sensor system of at least one device that is a sensor arrayed on the wheel itself. The smart wheel sensor system may include multiple types of sensors, which may each be configured to collect different types of smart wheel sensor system data. For example, the smart wheel sensor system may include a height sensor configured to produce barometric pressure sensor data; an acoustic sensor configured to produce acoustic sensor data; an image sensor configured to produce image sensor data; a gas sensor configured to produce gas sensor data; a magnetic sensor configured to produce magnetic sensor data; an accelerometer sensor configured to produce acceleration sensor data; a gyroscope sensor configured to produce gyroscopic sensor data; and a humidity sensor configured to produce humidity sensor data. In certain embodiments, these sensors may be woken up by a shock sensor that may sense an amount of energy produced by an energy harvester also on the smart wheel.

At block 1504, the smart wheel sensor system data may be communicated locally to a local smart wheel server from the device platforms arrayed on a smart wheel. This communication may be made via a communications interface. This communications interface may enable devices to communicate with each other over various communication mediums using known communication protocols, in accordance with various embodiments. For example, in some embodiments, the communications interface may provide communications using one or more communication networks following certain communication protocols, such as TCP/IP, http, https, ftp, and sftp protocols. Accordingly, the communications interface may include any suitable hardware, software, or combination of hardware and software that is capable of coupling the respective device platforms with the local smart wheel server. The communications interface may be arranged to operate with any suitable technique for controlling information signals using a desired set of communications protocols, services or operating procedures. In certain embodiments, this communications interface may be separate from a controller area network (CAN) bus, and thus have lower latency than communications across the CAN bus.

At block 1506, the smart wheel sensor system data may be analyzed or processed to determine a parameter value. This parameter value may characterize any type of real world parameter, such as an elevation, a sound pattern or sound level, an image pattern in an image or video, the amount of a type of gas, an orientation around a magnetic object, an amount of accelerator, an amount of angular velocity, a humidity level, and the like.

In certain embodiments, this parameter value may characterize a combination of different types of local smart wheel sensor system data and/or a combination of local smart wheel sensor system data with other data accessible to the local smart wheel server. For example, this parameter value may characterize a combination of one or more of: barometric pressure sensor data; acoustic sensor data; image sensor data; gas sensor data; magnetic sensor data; acceleration sensor data; gyroscopic sensor data; humidity sensor data, and the like. As another example, this parameter value may characterize a combination of local smart wheel sensor system data with other data, whether predetermined (e.g., vehicle build and other specifications) or received from outside of local smart wheel sensor system data (e.g., remote data, such as GPS data received from a satellite or data received from a remote server over a remote network).

For example, the smart wheel sensor system data may include barometric pressure sensor data that may be utilized to determine an elevation parameter value. This elevation parameter value may characterize an elevation of a smart wheel with respect to a reference point (e.g., a ground elevation) and/or relative to other smart wheels of a particular vehicle. As another example, the smart wheel sensor system data may include acoustic sensor data (e.g., sound) that may be utilized to determine an audio parameter value. This audio parameter value may characterize a sound detectible at the rotatable component. As another example, the parameter value may take into consideration (e.g., reflect) any of a variety of inputs, such as mileage, wheel dynamics, tire pressure, load conditions, road conditions, balancing information, height conditions, ambient sounds, brake dynamics, and the like.

In various embodiments, a parameter value may represent a probability (e.g., a probability of failure) as determined via application of a statistical model determined or trained by the local smart wheel server and/or a remote server. This statistical model may be trained using historical aggregated data (e.g., historical aggregated data of the local smart wheel sensor system or among multiple smart wheel sensor systems). This training may be produced using machine learning techniques (e.g., via supervised or unsupervised learning). These machine learning techniques may be, for example, decision tree learning, association rule learning, artificial neural networks, deep structured learning, inductive logic programming, support vector machines, cluster analysis, Bayesian networks, representation learning, similarity learning, sparse dictionary learning, learning classifier systems, and the like. Then, this statistical model may be applied to new or current smart wheel sensor data, to determine current parameter values (e.g., probabilities of failure). Such a statistical model may account for hidden variables, interaction variables, and the like to express such a probability. For example, these probabilities may represent a probability of brake pad failure (e.g., brake pad erosion), a prediction of rollover (e.g., a dangerous wheel elevation) and the like.

At block 1508, the local smart wheel server may determine a threshold value. In certain embodiments, these threshold values may be determined on the fly and determined alongside a determination of whether a parameter value meets (e.g., exceeds) a threshold value. However, in other embodiments, threshold determination may be done prior to a determination of whether a parameter value meets a threshold value. Thus, block 1508 is illustrated with dotted lines. In certain embodiments, the determination of parameter values may include retrieving predetermined parameter values from memory or from a remote server.

In various embodiments, a threshold value may be determined for each type of parameter value. For example, there may be separate threshold values for each, or a combination of, barometric pressure sensor data; acoustic sensor data; image sensor data; gas sensor data; magnetic sensor data; acceleration sensor data; gyroscopic sensor data; humidity sensor data, and the like. A threshold value may characterize, for example, a threshold amount of elevation, a threshold value of a particular sound pattern or sound level (e.g., where meeting a particular sound pattern or sound level would meet the threshold value), a threshold value of a particular image pattern in an image or video (e.g., where meeting a particular image pattern would meet the threshold value), a threshold value (e.g., amount) of a particular type of gas, a threshold value orientation around a magnetic object (e.g., a particular orientation, such as a particular north, south, east, or west compass orientation), a threshold value of acceleration, a threshold value of angular velocity, a threshold value of humidity, and the like.

As noted above, parameter values may be determined in accordance with a statistical analysis of a dataset of parameter values. For example, the parameter values may be aggregated across different criteria, such as different times (e.g., as historical parameter values) by types of parameter value (e.g., elevation, a sound pattern or sound level, an image pattern in an image or video, the amount of a type of gas, an orientation around a magnetic object, an amount of accelerator, an amount of angular velocity, a humidity level, and the like), different smart wheels, different device platforms, different vehicles, and the like. As another example, a parameter value may represent a probability as determined by a statistical model. In certain embodiments, by analyzing the aggregated data from various criteria, a threshold value may be determined based on detection of an outlier from the parameter values. In certain embodiments, these outliers may determine threshold values, which when met, may define an adverse condition. These outliers may be determined in accordance with a conventional statistical analysis for outliers. For example, a threshold value may be set as an outlier among various probabilities (e.g., a probability value that is an outlier).

At block 1510, a decision may be made as to whether any parameter values meet any associated threshold values. As introduced above, a parameter (e.g. a parameter value) may not necessarily represent a single value, but may also represent a pattern of values and/or a range or spectrum of values. If yes, the process 1500 may proceed to block 1512. If no, the process 1500 may return to block 1506.

At block 1508, an action may be performed in response to a parameter value meeting a threshold value. In certain embodiments, the action may be taken when a particular parameter value meets or exceeds a particular threshold value. The action taken may be, for example, the production of an alert for a driver of a vehicle or other operator of the vehicle, the application of an emergency brake system (e.g., activation of either pre breaking or full breaking), the activation of a particular safety or driving system, a notification of an unsafe driving condition associated with a driver in an online database, and the like.

For example, as noted above, an elevation parameter value may characterizes an elevation of a smart wheel off of a reference point (e.g., a ground elevation) and/or relative to other smart wheels of a particular vehicle. The meeting of the elevation parameter value with a threshold value amount of elevation may be indicative of an imminent turn over due to wheel elevation and thus provoke an action of an alert for a driver. As another example, as noted above, an audio parameter value may characterize a sound detectible at the rotatable component. The meeting of the audio parameter value with a threshold value of a particular sound pattern or sound level may be indicative of imminent brake failure due to rotor-shoe erosion noise or of tire tread erosion approaching dangerous levels. Meeting such an audio parameter threshold value may thus provoke an action of an alert for a driver or operator of a vehicle.

Although various embodiments referred to in connection with FIG. 15 may describe processing of sensor data at a local smart wheel server, in other embodiments the smart wheel sensor system data may be sent to a remote smart wheel server for processing. As discussed above in connection with FIG. 1, this processing of sensor data may be performed locally at the local smart wheel server or performed by a combination of both the local smart wheel server and the remote smart wheel server.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two, which can be designed using source coding or some other technique), various forms of program or design code incorporating instructions (which can be referred to herein, for convenience, as "software" or a "software module), or combinations of both. To clearly illustrate this interchangeability of hardware and software, various illustrative components, blocks, modules, circuits, and steps have been described above generally in terms of their functionality. Whether such functionality is implemented as hardware, firmware or software, or a combination of these technique, depends upon the particular application and design constraints imposed on the overall system. Skilled artisans can implement the described functionality in various ways for each particular application, but such implementation decisions should not be interpreted as causing a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. An energy harvester system, comprising:
   a substrate comprising:
      a first surface configured to contact and interface with a surface of a wheel, and
      a second surface opposite the first surface, wherein the second surface has a curved surface;
   a piezoelectric component configured to produce energy in response to mechanical strain imparted on the piezoelectric component, wherein a portion of the piezoelectric component is attached to a first portion of the second surface, the second surface comprising a second portion that is configured to contact the piezoelectric component when mechanical strain is imparted on the piezoelectric component, wherein the second portion is further configured to not contact the piezoelectric component when no mechanical strain is imparted on the piezoelectric component, and wherein the piezoelectric component is configured to deform while experiencing the mechanical strain so as to contact the second portion of the second surface; and
   an interconnect conductively coupled to the piezoelectric component, the interconnect being configured to conduct electrical energy from the piezoelectric component to a device coupled to the wheel.

2. The system of claim 1, wherein the piezoelectric component comprises multiple layers.

3. The system of claim 2, wherein the piezoelectric component comprises: a tensile load backing layer, a piezoelectric material layer, and an electrode layer.

4. The system of claim 3, wherein the electrode layer comprises an electrode configured to connect to the interconnect.

5. The system of claim 3, wherein the electrode is formed in a mesh configuration.

6. The system of claim 3, wherein the electrode layer is closer to the second surface than the tensile load backing layer.

7. The system of claim 3, wherein the electrode layer comprises an elongated electrode that traverses a two dimensional space.

8. The system of claim 1, wherein the first surface is curved in three dimensions along a length, a width, and a height of the substrate.

9. A system, comprising:
   a wheel comprising a staging surface formed therein, wherein the staging surface has a curved surface; and
   a piezoelectric component configured to produce energy in response to mechanical strain, wherein the piezoelectric component is flat and fixed to a first portion of the staging surface, the staging surface comprising a second portion that is configured to contact the piezoelectric component when mechanical strain is imparted on the piezoelectric component, wherein the second portion is further configured to not contact the piezoelectric component when no mechanical strain is imparted on the piezoelectric component, and wherein the piezoelectric component is configured to deform and contact the second portion of the staging surface while experiencing the mechanical strain.

10. The system of claim 9, wherein the wheel comprises a rim, and wherein the staging surface is part of a depression along the rim.

11. The system of claim 9, wherein the piezoelectric component comprises a piezoelectric material layer between two electrode layers.

12. The system of claim 11, wherein the two electrode layers comprise different mesh structures.

13. The system of claim 9, wherein the wheel has a spherical shape.

14. The system of claim 9, wherein the piezoelectric component comprises a piezoelectric material that is least one of: a crystal and semiconductor material or a polymer and organic material.

15. The system of claim 9, wherein the wheel comprises an airless tire and the staging surface is along a spoke of the airless tire.

16. A method, comprising:
   rotating a wheel, wherein the wheel comprises a staging surface formed in the wheel, wherein the staging surface has a curved surface;
   deforming a piezoelectric component, wherein the piezoelectric component configured to produce energy in response to mechanical strain, wherein the piezoelectric component is flat and fixed to a first portion of the staging surface, and wherein the piezoelectric component is configured to deform and contact a second portion of staging surface while experiencing the mechanical strain, wherein the second portion of the staging surface is further configured to not contact the piezoelectric component when not experiencing the mechanical strain; and
   powering a device located on the wheel using the energy.

17. The method of claim 16, further comprising:
   receiving, at a processor located within a vehicle body, sensor data from the device, wherein the device is configured to produce the sensor data while disposed on the wheel;
   determining a parameter value based on the sensor data; and
   performing an action based on the parameter value meeting a threshold value.

18. The method of claim 17, wherein the parameter value is based on the sensor data and data received from a remote server.

19. The method of claim 17, wherein the device is configured to send the sensor data to the processor via a wireless connection.

20. The method of claim 16, wherein the piezoelectric component is configured to contact a surface on which the wheel is configured to rotate.

* * * * *